(12) United States Patent
Nakagawa

(10) Patent No.: US 8,179,292 B2
(45) Date of Patent: May 15, 2012

(54) DATA MODULATION APPARATUS, DATA MODULATION METHOD, DATA MODULATION PROGRAM, AND RECORDING MEDIUM

(75) Inventor: Toshiyuki Nakagawa, Kanagawa (JP)

(73) Assignee: Sony Corporation, Tokyo (JP)

( * ) Notice: Subject to any disclaimer, the term of this patent is extended or adjusted under 35 U.S.C. 154(b) by 67 days.

(21) Appl. No.: 12/886,961

(22) Filed: Sep. 21, 2010

(65) Prior Publication Data

US 2011/0084859 A1 Apr. 14, 2011

(30) Foreign Application Priority Data

Oct. 14, 2009 (JP) .................................. 2009-237553

(51) Int. Cl.
*H03M 7/00* (2006.01)
*H03M 7/40* (2006.01)
(52) U.S. Cl. ........................... 341/59; 341/67; 369/59.23
(58) Field of Classification Search .................... 341/58, 341/59, 67; 360/40; 369/59.23–59.25
See application file for complete search history.

(56) References Cited

U.S. PATENT DOCUMENTS

| 7,466,246 | B2* | 12/2008 | Kahlman et al. | 341/59 |
| 2003/0085820 | A1* | 5/2003 | Hayami et al. | 341/59 |
| 2005/0017881 | A1* | 1/2005 | Nakagawa et al. | 341/58 |
| 2007/0103353 | A1* | 5/2007 | Nakagawa | 341/143 |

FOREIGN PATENT DOCUMENTS

JP 11-177431 7/1999

* cited by examiner

*Primary Examiner* — Howard Williams
(74) *Attorney, Agent, or Firm* — Oblon, Spivak, McClelland, Maier & Neustadt, L.L.P.

(57) ABSTRACT

A data modulation apparatus includes: insertion means for inserting information bits into data at a predetermined interval; conversion means for converting the data into which the information bits are inserted into an RLL code based on a modulation table that has a variable-length conversion rule; setting means for setting a control section that is used for calculating a value of the information bit; and determination means for determining the value of the information bit inserted into the control section that is different from a calculation target by calculating the code of the control section.

18 Claims, 13 Drawing Sheets

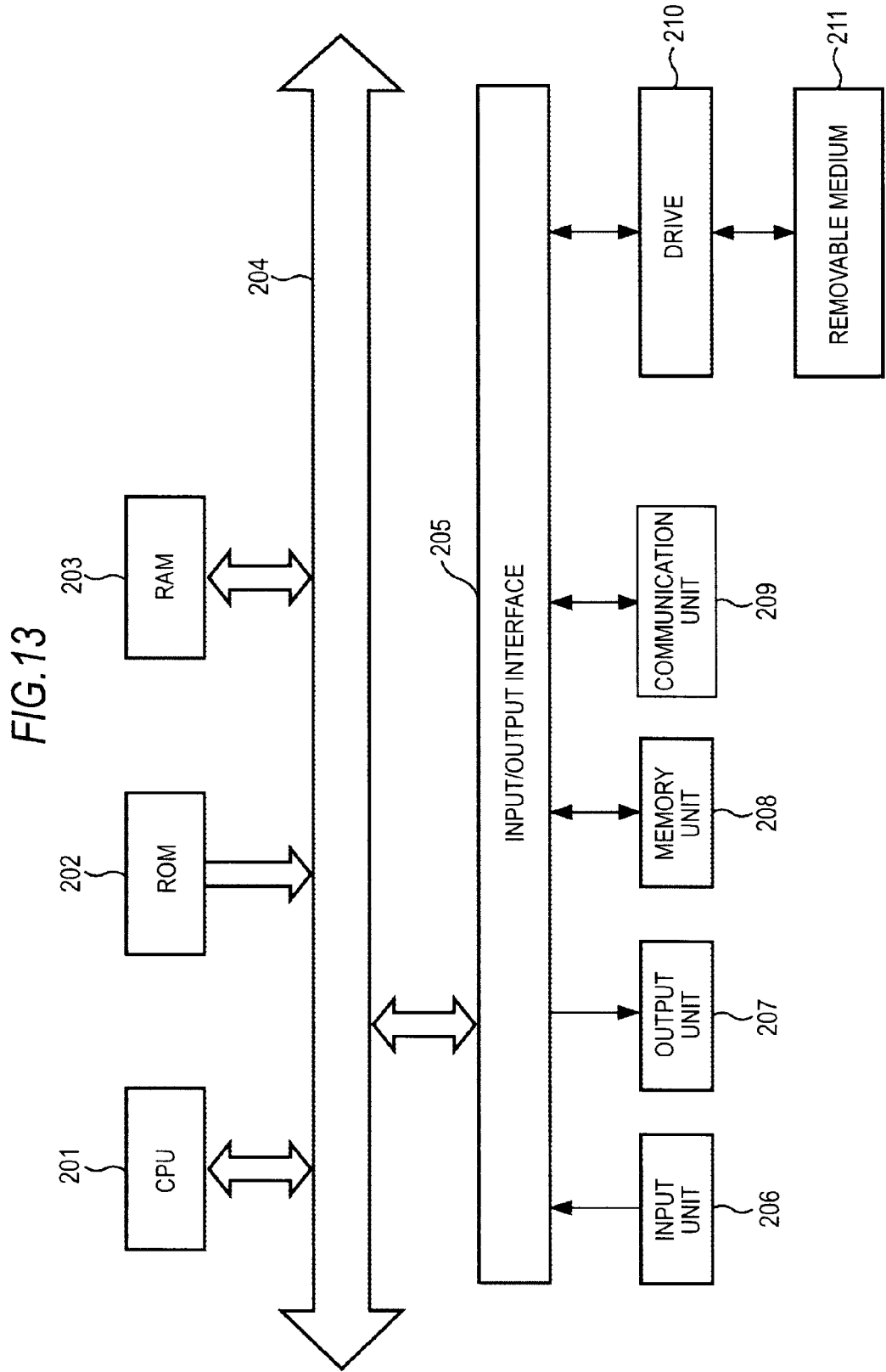

DATA MODULATION APPARATUS, DATA MODULATION METHOD, DATA MODULATION PROGRAM, AND RECORDING MEDIUM

BACKGROUND OF THE INVENTION

1. Field of the Invention

The present invention relates to a data modulation apparatus, a data modulation method, and a data modulation program, and more particularly, to a data modulation apparatus, a data modulation method, and a data modulation program that can stabilize the recording and reproducing characteristics.

2. Description of the Related Art

When data is transferred through a predetermined transmission line or is recorded on a recording medium such as a magnetic disk, an optical disc, or a magneto optical disc, the data is modulated so as to be appropriate for the transmission line or the recording medium. As one of the modulation methods, block coding is known. In the block coding, a data row is divided into blocks in units (hereinafter, referred to as data words) formed of m×i bits, and the data word is converted into a code word formed of n×i bits in accordance with an appropriate coding rule. Hereinafter, bits of a code word are also referred to as channel bits. When i=1, this code becomes a fixed-length code. On the other hand, when a plurality of "i"s are selectable, in other words, when conversion is performed by selecting a predetermined i from the range of 1 to imax (maximum i), the code becomes a variable-length code. This code that is block-coded is denoted by a variable length code (d, k;m, n;r).

Here, i is referred to as a constraint length, and imax becomes r (maximum constraint length). In addition, d, for example, represents the minimum number of consecutive "0"s interposed between consecutive "1"s, that is, a minimum run of "0"s, and k represents the maximum number of consecutive "0"s interposed between consecutive "1"s, that is, a maximum run of "0"s.

When the code word acquired as described above is recorded on an optical disc, a magneto optical disc, or the like, for example, for a compact disc (CD) or a mini disc (MD) (registered trademark), NRZI (NonReturn to Zero Inverted) modulation is performed in which "1" is for inversion and "0" is for non-inversion based on a variable-length code row, and recording is performed based on an NRZI-modulated variable-length code (hereinafter, referred to as a recording waveform row). This is referred to as mark edge recording. On the other hand, for an ISO-standard magneto optical disc having a size of 3.5 inches and a capacity of 230 MB or the like, the code row for which recording modulation is performed is recorded without being modulated through NRZI modulation. This is referred to as mark position recording. For a recording media having a high recording density that is currently used, the mark edge recording is widely used.

When a minimum inversion interval and a maximum inversion interval of the recording waveform row are Tmin and Tmax, in order to perform high-density recording in the direction of the linear speed, it is preferable that the minimum inversion interval Tmin is increased, that is, the minimum run d is increased. In addition, from the viewpoint of clock recovery, it is preferable that the maximum inversion interval Tmax is decreased, that is, the maximum run k is decreased. In a case where the overwrite characteristics are considered, it is preferable that Tmax/Tmin is decreased. In addition, various modulation methods are proposed and are practically used by considering the conditions of a medium such as significance of an increase in the detection window width Tw=m/n from the viewpoint of Jitter or S/N.

Here, in particular, the modulation methods that are proposed or practically used for an optical disc, a magnetic disk, a magneto optical disc, or the like will be briefly described. An EFM code (represented by (2,10;8,17;1)) that is used for a CD or an MD, an 8-16 code (represented by (2,10;1,2;1)) that is used for a DVD (Digital Versatile Disc), and an RLL (2,7) (represented by (2,7;m, n;r)) that is used for a PD (120 mm and a capacity of 650 MB) are RLL codes having a minimum run d=2. In addition, an RLL (1,7) (represented by (1,7;2, 3;r)) that is used for an MD-DATA2 or an ISO-standard 3.5 inch MO (a capacity of 640 MB) is an RLL code having a minimum run d=1. In addition, an RLL code (Run Length Limited code) having a minimum run d=1 in which the size of the minimum mark or the conversion efficiency is balanced is widely used in a recording and reproducing apparatus of a disc such as an optical disc or a magneto optical disc having a high recording density, which is currently developed and researched.

For example, the modulation table of the variable-length RLL (1,7) code is a table as follows.

TABLE 1

| RLL(1,7):(d, k;m, n;r) = (1,7;2,3;2) | | |
|---|---|---|
| | Data Pattern | Code Pattern |
| i = 1 | 11 | 00x |
| | 10 | 010 |
| | 01 | 10x |
| i = 2 | 0011 | 000 00x |
| | 0010 | 000 010 |
| | 0001 | 100 00x |
| | 0000 | 100 010 |

Here, a symbol x represented in the modulation table is "1" when the next following channel bit is "0". On the other hand, the symbol x is "0" when the next following channel bit is "1". Here, the maximum constraint length r is 2.

The parameter of the variable-length RLL (1,7) is (1,7;2, 3;2). Thus, when the bit interval of the recording waveform row is T, the minimum inversion interval Tmin represented by (d+1)·T becomes 2 (=1+1)·T. When the bit interval of the data row is Tdata, the minimum inversion interval Tmin represented by (m/n)×2 becomes 1.33 (=(⅔)×2)·Tdata. In addition, the maximum inversion interval Tmax represented by (k+1)·T is Tmax=8 (=7+1)·T (=(m/n)×8Tdata=(⅔)× 8Tdata=5.33 Tdata). Furthermore, the detection window width Tw is represented by (m/n)×Tdata, and the value of Tw=0.67(=⅔) Tdata.

In the channel bit row for which the modulation according to the RLL (1, 7) shown in Table 1 is performed, the occurrence frequency of 2T that is Tmin is the highest, and thereafter the occurrence frequency is higher in order of 3T, 4T, 5T, 6T, . . . . Then, when 2T that is the minimum run (Tmin) is repeated, in other words, when edge information is generated much in a short period, it is frequently advantageous for clock recovery.

For example, when the recording linear density is increased further in the recording and reproducing an optical disc, the minimum run becomes a portion in which error can easily occur. The reason for this is as follows. When a disc is reproduced, the waveform output of the minimum run is smaller than that of other run and can be easily influenced, for example, by defocusing, tangential tilt, or the like. In addition, the reproduction of consecutive minimum mark recording in a high recording linear density can be easily influenced by external disturbances such as noise. Accordingly, error in the data reproduction can easily occur. As an erroneous pattern of data reproduction for such a case, there is a case where a leading edge to a falling edge of the consecutive minimum marks erroneously shifts together. In other words, the occurring bit error length propagates from the start to the end of a section in which the minimum run continues. Accordingly, there is a problem that the propagation of the error is long.

In order to stabilize a case where data is recorded and reproduced with a high linear density, it is effective to limit the continuation of the minimum run.

On the other hand, when data is recorded on a recording medium or data is transferred, coding modulation that is appropriate for the recording medium or the transmission line is performed. However, when a low-frequency band component is included in the modulated code, for example, various error signals such as tracking error in servo control of a disk device may easily change or jitter can easily occur. Accordingly, it is preferable that the low-frequency band component of the modulated code is suppressed possibly as it can be.

As a method of suppressing the low-frequency band component, there is DSV (Digital Sum Value) control. A DSV represents a sum when the channel bit row is allowed to be NRZI (that is, level-coded) so as to be a recording code row and the codes are added as "+1" for "1" of the bit row (symbol of data) and as "−1" for "0" of the bit row. The DSV becomes a reference for a low-frequency band component of the recording code row. By decreasing the absolute value of the positive or negative shake of the DSV, in other words, by performing the DSV control, a DC component of the recording code row is excluded, and accordingly, the low-frequency band component is suppressed.

The DSV control is not performed for the modulated code that is modulated based on the variable-length RLL (1, 7) table shown in Table 1. The DSV control for such a case is implemented by calculating the DSV at a predetermined interval in the coding row after modulation (the channel bit row) and inserting a predetermined DSV bit into the coding row (the channel bit row) (for example, JP-A-11-177431).

The number of DSV bits inserted into the channel bit row is determined on the basis of the minimum run d. When DSV bits are inserted in arbitrary positions within a code word so as to maintain the minimum run for the case of d=1, the necessary number of bits is 2 (=d+1) channel bits. In addition, in order to maintain the maximum run, the necessary number of bits is 4 (=2×(d+1)) channel bits in a case where the DSV bits are inserted in arbitrary positions within a code word. When the DSV control is performed with the number of channel bits less than the above-described number of channel bits, there is a case where it is difficult to perform the DSV control depending on the prior or next pattern.

In the RLL (1, 7) code in which (d, k;m, n)=(1,7;2, 3), when the DSV bits are converted into data together with the conversion ratio, the DSV bits correspond to 4 channel bits×2/3=8/3=2.67 data (2.67 Tdata).

The DSV bits are basically redundant bits. Accordingly, when the efficiency of the code conversion is considered, it is preferable that the number of the DSV bits is decreased possibly as it can be.

In addition, it is preferable that the minimum run d and the maximum run k are not changed by the inserted DSV bits. The reason for this is that changes in (d, k) influence the recording and reproducing characteristics.

However, in the actual RLL code, the minimum run has significant influence on the recording and reproducing characteristics, and accordingly, the minimum run is necessarily maintained. However, the maximum run is not necessarily maintained. Thus, depending on the situations, there is a format in which a pattern that breaks the maximum run is used as a synchronization pattern. The maximum run of the 8-16 code of the DVD (Digital Versatile Disc) is 11T. However, for example, 14T exceeding the maximum run is given in a synchronization pattern portion so as to increase the detection capability of the synchronization pattern.

SUMMARY OF THE INVENTION

However, even when DSV control is defined to be performed in the format, there are cases where the DSV control is not necessary depending on the system. In a case where suppression of a DC component is not necessary for the format that is predetermined in the system, the bits used for the DSV control that are inserted at a predetermined interval become redundant bits.

In addition, even when suppression of the DC component is necessary, in a case where the suppression of the DC component is performed more than necessary for the format predetermined in the system, the bits used for the DSV control that are inserted at a predetermined interval may be considered as being redundant.

Thus, it is desirable to stabilize the recording and reproducing characteristics while using a predetermined format.

According to an embodiment of the present invention, there is provided a data modulation apparatus including: insertion means for inserting information bits into data at a predetermined interval; conversion means for converting the data into which the information bits are inserted into an RLL code based on a modulation table that has a variable-length conversion rule; setting means for setting a control section that is used for calculating a value of the information bit; and determination means for determining the value of the information bit inserted into the control section that is different from a calculation target by calculating the code of the control section.

The above-described setting means may set a block of the control section between a last bit of a data pattern immediately prior to the information bit and a next bit with the information bit inserted into the data used as a reference.

The above-described insertion means may insert the information bit having the value calculated based on the code of the control section that becomes a calculation target into the control section that is positioned on the backward side of the control section that becomes a calculation target.

It may be configured that the above-described setting means sets a DSV control section and a parity calculating section as the control section that becomes the calculation target, the above-described determination means calculates a DSV based on the code of the DSV control section that becomes a calculation target as the information bit and calculates parity of the parity calculating section that becomes a calculation target as the information bit, and the above-described insertion means inserts the information bit of the DSV calculated based on the code of the DSV control section that becomes the calculation target into the DSV control section that becomes a calculation target and inserts the information bit of the parity of the parity calculating section that becomes the calculation target into the parity calculating section that is positioned on the backward side of the parity calculating section that becomes the calculation target.

The parity calculating section and the DSV control section may be sections different from each other.

The above-described insertion means may insert identification information that indicates insertion of the information bit into a synchronization signal.

The RLL code having the variable-length rule may have a parity conserving pattern in the relationship between the data before conversion and the code after the conversion.

The table of the RLL code having the variable-length rule may have a minimum run d=1, a maximum run k=7, a basic data length m=2, and a basic code word length n=3, and has a rule in which continuation of the minimum run is limited to a predetermined limited number of times or less as the conversion rule.

The above-described setting means may set a block immediately after a bit positioned a predetermined number of bits prior to the information bit with the information bit inserted into the data used as a reference.

According to another embodiment of the present invention, there is provided a data modulation method of a data modulation apparatus that includes insertion means, conversion means, setting means, and determination means. The data modulation method includes the steps of: inserting information bits into data at a predetermined interval by using the insertion means; converting the data into which the information bits are inserted into an RLL code based on a modulation table that has a variable-length conversion rule by using the conversion means; setting a control section that is used for calculating a value of the information bit by using the setting means; and determining the value of the information bit inserted into the control section that is different from a calculation target by calculating the code of the control section by using the determination means.

According to still another embodiment of the present invention, there is provided a program that allows a computer to serve as insertion means, conversion means, setting means, and determination means. The insertion means inserts information bits into data at a predetermined interval, the conversion means converts the data into which the information bits are inserted into an RLL code based on a modulation table that has a variable-length conversion rule, the setting means sets a control section that is used for calculating a value of the information bit, and determination means for determining the value of the information bit inserted into the control section that is different from a calculation target by calculating the code of the control section.

According to one embodiment of the present invention, the insertion means inserts information bits into data at a predetermined interval; the conversion means converts the data into which the information bits are inserted into an RLL code based on a modulation table that has a variable-length conversion rule; the setting means sets a control section that is used for calculating a value of the information bit; and the determination means determines the value of the information bit inserted into the control section that is different from a calculation target by calculating the code of the control section.

According to yet another embodiment of the present invention, there is provided a recording medium that is recorded by using a channel bit that is modulated in accordance with the above-described data modulation method.

According to still yet another embodiment of the present invention, there is provided a data modulation apparatus including: insertion means for inserting information bits into data at a predetermined interval; conversion means for converting the data into which the information bits are inserted into an RLL code based on a modulation table that has a variable-length conversion rule; setting means for setting a control section that is used for calculating a value of the information bit; and determination means for determining the value of the information bit inserted into the control section by calculating the code of the control section. The insertion means inserts identification information relating to a position of a block of the control section into a synchronization signal.

According to further another embodiment of the present invention, there is provided a data modulation method of a data modulation apparatus including: insertion means for inserting information bits into data at a predetermined interval; conversion means for converting the data into which the information bits are inserted into an RLL code based on a modulation table that has a variable-length conversion rule; setting means for setting a control section that is used for calculating a value of the information bit; and determination means for determining the value of the information bit inserted into the control section by calculating the code of the control section. The insertion means inserts identification information relating to a position of a block of the control section into a synchronization signal.

According to still further another embodiment of the present invention, there is provided a program that allows a computer to serve as: insertion means for inserting information bits into data at a predetermined interval; conversion means for converting the data into which the information bits are inserted into an RLL code based on a modulation table that has a variable-length conversion rule; setting means for setting a control section that is used for calculating a value of the information bit; and determination means for determining the value of the information bit inserted into the control section by calculating the code of the control section. The insertion means inserts identification information relating to a position of a block of the control section into a synchronization signal.

According to yet further another embodiment of the present invention, there is provided a recording medium that is recorded by using a channel bit that is modulated in accordance with the above-described data modulation method.

According to another one embodiment of the present invention, the insertion means inserts information bits into data at a predetermined interval, the conversion means converts the data into which the information bits are inserted into an RLL code based on a modulation table that has a variable-length conversion rule, the setting means sets a control section that is used for calculating a value of the information bit, and the determination means determines the value of the information bit inserted into the control section by calculating the code of the control section. The insertion means inserts identification information relating to a position of a block of the control section into a synchronization signal.

As described above, according to the embodiments of the present invention, the recording and reproducing characteristics can be further stabilized.

BRIEF DESCRIPTION OF THE DRAWINGS

FIG. 13 is a block diagram representing the configuration of a personal computer according to an embodiment of the present invention.

DESCRIPTION OF THE PREFERRED EMBODIMENTS

Figure 1:
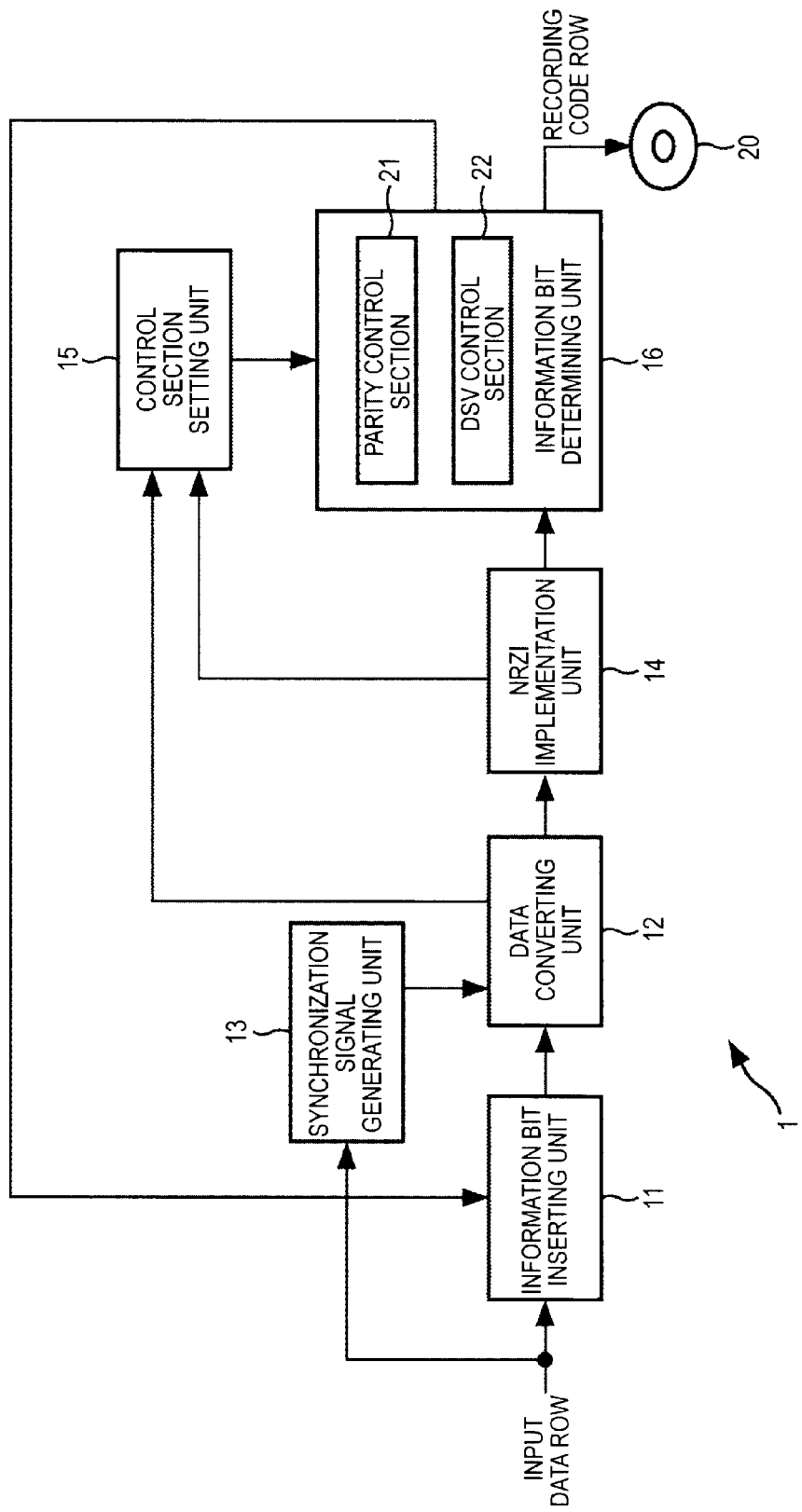
FIG. 1 is a block diagram representing the basic configuration of a data modulation apparatus according to an embodiment of the invention.

Hereinafter, modes for carrying out the present invention (hereinafter referred to as embodiments) will be described. The description will be described in the following order.
1. First Embodiment
2. Second Embodiment

1. First Embodiment

[Modulation Table]

First, a modulation table that is used in an embodiment of the present invention will be described.

Table 2 is a modulation method of the 1,7PP code corresponding to a higher recording density, compared to a modulation method represented in Table 1.

TABLE 2

| 1,7PP:(d,k;m,n;r) = (1,7;2,3;4) | |
|---|---|
| Data Pattern | Code Pattern |
| 11 | *0* |
| 10 | 001 |
| 01 | 010 |
| 0011 | 010 100 |
| 0010 | 010 000 |
| 0001 | 000 100 |
| 000011 | 000 100 100 |
| 000010 | 000 100 000 |
| 000001 | 010 100 100 |
| 000000 | 010 100 000 |
| 110111 | 001 000 000 (next 010) |
| 00001000 | 000 100 100 100 |
| 00000000 | 010 100 100 100 |

If xx1 then *0* = 000
xx0 then *0* = 101
Sync & Termination
01 001 000 000 001 000 000 001 (24 channel bits)
# = 0 not terminate case
# = 1 terminate case

| Termination table | |
|---|---|
| 00 | 000 |
| 0000 | 010 100 |
| 110111 | 001 000 000 (next 010): |

When next channel bits are '010', convert '11 01 11' to '001 000 000'. is converted into a code pattern "101".

The basic pattern included in the modulation table of Table 2 has a variable-length structure. In other words, the number of the basic patterns of the case where a constraint length i=1 is configured as three (three including "*0*", "001", and "010"), which is smaller than the necessary number of four ($2^m=2^2=4$). As a result, when a data row is converted, there is a data row that is difficult to convert with the constraint length i=1 alone. Consequently, in Table 2, in order to convert all the data rows (in order to establish a modulation table), reference is made to the basic patterns of the constraint length i up to three.

In addition, the modulation table of Table 2 has a substitution pattern that limits the continuation of the minimum run d. Accordingly, when the data pattern is "(110111)", a code word row that follows the data pattern is referred to. Then, in a case where the code word row is "010", the data pattern is substituted with a six-data pattern code pattern "001 000 000". On the other hand, in a case where the following code word row is not "010", the data pattern is converted into a code pattern on the basis of two data units ((11), (01), and (11)). Thus, the data pattern is converted into a code word "*0*010*0*". Accordingly, for the code word row acquired by converting the data, the continuation of the minimum run is limited. Thus, the minimum run is repeated at a maximum of six times.

In the modulation table of Table 2, the maximum constraint length r=4. The conversion patterns at the constraint length i=4 are configured by substitution patterns (maximum run assuring patterns) for implementing the maximum run k=7. In other words, a data pattern "(00001000)" is configured to be converted into a code pattern "000 100 100 100", and a data pattern "(00000000)" is configured to be converted into a code pattern "010 100 100 100". Even in such a case, the minimum run d=1 can be maintained.

Furthermore, in Table 2, in order to interpose a synchronization pattern between code patterns, in a case where a data row is to be terminated at an arbitrary position, a termination pattern is used, so that a data row becomes a termination position at "(00)" or "(0000)". The leading one code word of the inserted synchronization pattern is an identification bit of the termination pattern use. Thus, when the termination pattern is used, the leading code word of the immediately following synchronization pattern row is "1". On the other hand, when the termination pattern is not used, the the leading code word of the immediately following synchronization pattern row is "0". In addition, in order to detect the identification bit of the termination pattern use and the synchronization pattern described above, the synchronization pattern represented in Table 2 is configured by a total of a 24-code word by repeating the code pattern of k=8, which exceeds the maximum run k=7, two times.

The conversion patterns shown in Table 2 have a conversion rule in which the remainder when the number of "1"s as the elements of the data pattern is divided by two and the remainder when the number of "1"s as the elements of the converted code pattern is divided by two are equal to one or zero. In other words, in Table 2, there is a conversion rule in which any elements corresponding to each other have an even or odd number of "1"s. In other words, in Table 2, there is a pattern in which parity is conserved in the relationship between the data before the conversion and the code after the conversion. For example, of the conversion patterns, the data pattern "(000001)" corresponds to the code pattern "010 100 100". Here, the number of "1"s as the elements thereof is one in the data pattern and three in the code pattern corresponding thereto. Thus, the remainder when the number of "1"s included in either the data pattern or the corresponding code pattern is divided by two is the same as one (an odd number). Similarly, of the conversion patterns, the data pattern "(000000)" corresponds to the code pattern "010 100 000". Here, the number of "1"s is zero in the data pattern, and the number of "1"s is two in the code pattern corresponding thereto. Thus, the remainder when the number of "1"s included in the data pattern or the code pattern corresponding thereto is divided by two is the same as zero (an even number).

Next, a method of performing DSV control will be described. General DSV control such as the case of the RLL (1, 7) code represented in Table 1, for example, is performed by modulating a data row and then adding DSV bits of at least (d+1) bits to a channel bit row after modulation at a predetermined interval in a case where DSV control is not performed on a modulation table. Also in a case where the modulation table as represented in Table 2 is used, the DSV control can be performed similarly to the general case. However, by utilizing the relationship between the data pattern and the code pattern that is represented in Table 2, the DSV control can be performed more efficiently. In other words, in the modulation table, there is a conversion rule in which the remainder when the number of "1"s as the elements of the data pattern is divided by two and the remainder when the number of "1"s as the elements of the code pattern is divided by two are the equal to one or zero. At this time, inserting a DSV bit of "1" representing "inversion" or "0" representing "non inversion" into the channel bit row as described above is equivalent to inserting a DSV bit of "(1)" for "inversion" or "(0)" for "non inversion" into the data bit row.

For example, in Table 2, in a case where a DSV bit is configured to be added after three bits of "(001)", for which data conversion is performed, is followed, the data becomes "(001x)" (here, x is one bit of "0" or "1"). Here, when "0" is given to x, in the modulation table of Table 2, conversion of the data pattern "0010" into a code pattern "010 000" is performed. On the other hand, when "1" is given to x, conversion of data pattern "0011" into a code pattern "010 100" is performed. When a level code row is generated by performing NRZI for the code word row, these become as follows.

| Data Pattern | Code Pattern | Level Code Row |
|---|---|---|
| 0010 | 010 000 | 011111 |
| 0011 | 010 100 | 011000 |

Thus, the last three bits of the level code rows are inverted with respect to each other. This represents that the DSV control can be performed within the data row by selecting "(1)" and "(0)" as the DSV bit x.

When the redundancy according to the DSV control is considered, performing the DSV control using one bit within the data row corresponds to performing the DSV control using 1.5 channel bits, based on the conversion ratio (m:n=2:3) represented in Table 2, in terms of the channel bit row. In the RLL (1, 7) table as Table 1, in order to perform the DSV control, it is necessary to perform the DSV control for the channel bit row. In such a case, in order to maintain the minimum run, at least two channel bits are necessary, and the redundancy becomes higher than that of the DSV control of Table 2. In other words, in the table structure of Table 2, by performing the DSV control within the data row, the DSV control can be effectively performed.

The variable-length table as Table 2, which has the minimum run and the maximum run of (d, k)=(1, 7) described as above, corresponding to a high recording density, for example, is employed as a format of Blu-ray Disc ReWritable ver 1.0 (registered trademark) that is a high-density optical disc system.

In the future, a more stable system is demanded for a method of conversion between data and channel bits for a new high recording density, that is, described in detail, for example, a high-density standard supporting a density higher than that of a high-density optical disc.

When a variable-length table, for example, that is employed in the Blu-ray Disc ReWritable ver 1.0, which is commercially available, is used, and a more stable system is implemented, a general design technique can be used. Accordingly, the design risk for designing hardware can be reduced.

[Configuration of Data Modulation Apparatus]

FIG. 1 is a block diagram representing the basic configuration of a data modulation apparatus according to an embodiment of the invention.

The data modulation apparatus 1 has an information bit inserting unit 11, a data converting unit 12, a synchronization signal generating unit 13, an NRZI implementation unit 14, a control section setting unit 15, and an information bit determining unit 16. The information bit determining unit 16 has a parity control section 21 and a DSV control section 22.

The information bit inserting unit 11, which is an insertion unit that inserts information bits into data at a predetermined interval, inserts information bits into input data at the predetermined interval. In this embodiment, the information bit is a parity bit or a DSV bit. From the information bit inserting unit 11, a data row into which the information bits are inserted is output, and positional information on the positions in which the information bits are inserted is additionally output. This positional information is used by each unit disposed on later stages as is necessary.

The data converting unit 12, which is a conversion unit that converts the data, into which the information bits are inserted, into a code based on a modulation table to which a variable-length conversion rule is applied, converts the data output from the information bit inserting unit 11 into a channel bit row based on a predetermined variable-length table (for example, Table 2 described above). In the channel bit row, for example, the number of "0"s inserted between consecutive "1"s is one as a minimum and is seven as a maximum.

The synchronization signal generating unit 13 generates a synchronization signal based on the variable-length table of Table 2 in synchronization with the input data row and outputs the generated synchronization signal to the data converting unit 12. This synchronization signal pattern is formed of a channel bit row. The data converting unit 12 combines the channel bit row acquired by converting the data supplied from the information bit inserting unit 11 with the channel bit row of the synchronization signal pattern that is supplied from the synchronization signal generating unit 13 and outputs the combined channel bit row to the NRZI implementation unit 14.

The NRZI implementation unit 14 implements the NRZI of the channel bit row supplied by the data converting unit 12. Here, the implementation of the NRZI, as described above, is a conversion in which inversion between "0" and "1" is performed at the channel bit of "1", and the value is maintained at the channel bit of "0". Here, the code for which the NRZI implementation is performed is referred to as a level code. When the level code becomes a code that is finally recorded, it is referred to as a recording code row.

The control section setting unit 15 as a setting unit that sets a control section for calculating the value of information bits delimited by a block sets a control section by using information on the level code output from the NRZI implementation unit 14 and information on the determined length output from the data converting unit 12, which is a variable length when the data is converted into channel bits, as input information and outputs the set control section to the information bit determining unit 16.

The information bit determining unit 16, which is a determination unit that calculates the code of the control section and determines the value of an information bit inserted into a control section other than the calculation target, determines and outputs a final recording code row. The recording code row is the format of a level code in terms of a line of "1" and "0". Accordingly, when the control section that is set by the control section setting unit 15 is a parity calculating section, the parity control section 21 determines a parity bit of the parity calculating section and outputs the determined parity bit to the information bit inserting unit 11. On the other hand, when the control section that is set by the control section setting unit 15 is a DSV control section, the DSV control section 22 determines a DSV bit of the DSV control section. Then, the DSV control section 22 selects a level code including the determined DSV bit from among the level codes input from the NRZI implementation unit 14 as a recording code row and outputs the recording code row. The output recording code row is transferred or is recorded on a recording medium 20 such as a Blu-ray Disc (trademark).

Figure 2:
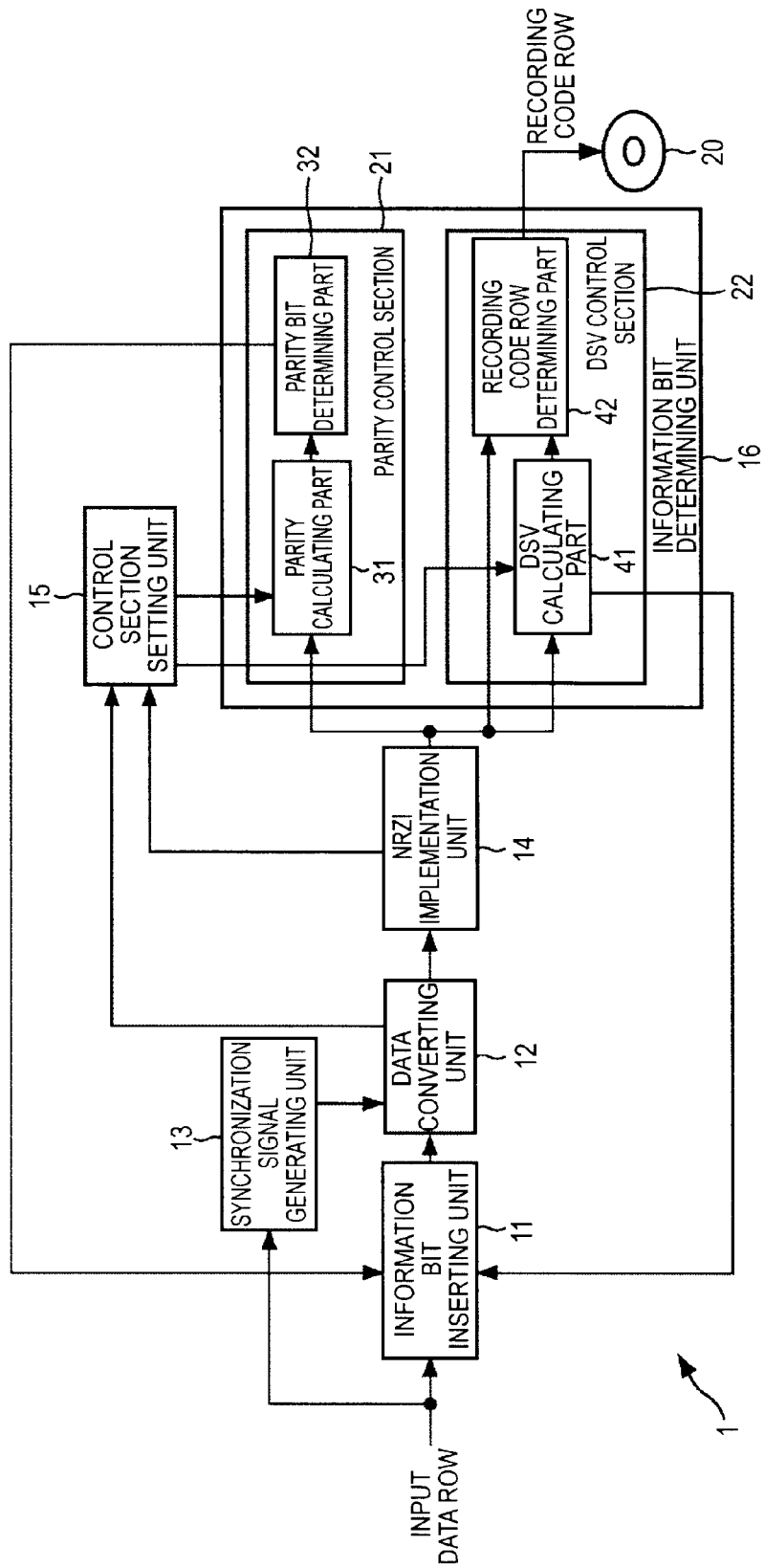
FIG. 2 is a block diagram representing the configuration of a data modulation apparatus according to an embodiment of the invention.

FIG. 2 is a block diagram representing the configuration of the data modulation apparatus when the data modulation apparatus 1 shown in FIG. 1 is more concretely configured.

In the data modulation apparatus 1 shown in FIG. 2, the parity control section 21 is configured by a parity calculating part 31 and a parity bit determining part 32. In addition, the DSV control section 22 is configured by a DSV calculating part 41 and a recording code row determining part 42.

The parity calculating part 31 performs parity calculation by using the level code row output from the NRZI implementation unit 14. A calculation section for calculating parity is set by the control section setting unit 15. The calculation of the parity is performed, for example, by counting the number of "1"s from the level code in the parity calculating section and identifying whether the result is an even number or an odd number.

The parity bit determining part 32 determines a parity bit based on the result calculated by the parity calculating part 31 and supplies the parity bit to the information bit inserting unit 11 so as to be inserted into a predetermined insertion position. In this embodiment, the insertion position is assumed to be a data row in a parity calculating section that is disposed on the backward side of the parity calculating section as the calculation target of the parity bit.

The DSV calculating part 41 of the DSV control section 22 performs DSV calculation by using the level code row output from the NRZI implementation unit 14. The calculation section for the DSV calculation is set by the control section setting unit 15. The DSV calculation, for example, is performed as follows. From the level code in a designated DSV control section, the number of "1"s is counted, and then, the number of "0"s is additionally counted. Then, information acquired by combining a difference between the numbers of "1"s and "0"s and the accumulated DSV that has been accumulated up to that point is generated. An accumulated DSV that is close to zero is selected from between the accumulated DSV of the case where the DSV bit of "(1)" is given as the information bit and the accumulated DSV of the case where the DSV bit of (0) is given as the information bit.

In addition, the DSV calculating part 41 may be configured to output the next DSV bit insertion position to the information bit inserting unit 11.

The recording code row determining part 42 selects one of the level codes, input by the NRZI implementation unit 14, in which the DSV bit of "(1)" is given and the DSV bit of "0" is given as a recording code row and outputs the selected level code. This selection is performed based on the result of calculation of the DSV calculating part 41.

The operation timings of the units, sections, and parts are managed so as to be in synchronization with a timing signal that is supplied from a timing management unit not shown in the figure.

[Recording Code Row Generating Process]

Next, the recording code row generating process that is performed by the data modulation apparatus 1 shown in FIG. 2 will be described with reference to a flowchart represented in FIG. 3.

Figure 3:
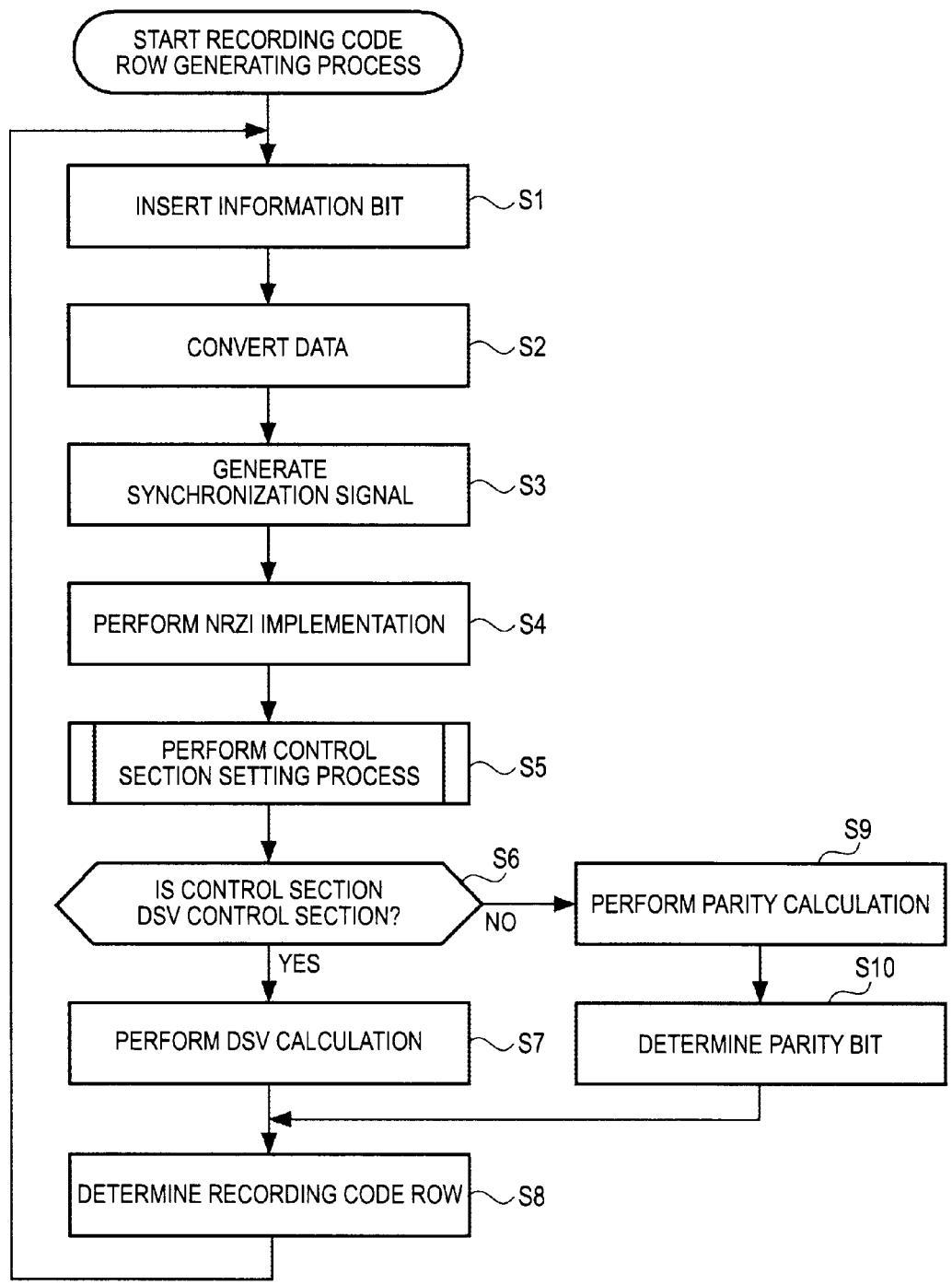
FIG. 3 is a flowchart illustrating a recording code row generating process.

FIG. 3 is a flowchart illustrating the recording code row generating process.

In Step S1, the information bit inserting unit 11 inserts an information bit into an input data row. In this embodiment, data is delimited in units of 45 bits, and immediately after each unit, an information bit of one bit is inserted. Accordingly, the insertion position of the information bit can be determined by the information bit inserting unit 11 by counting the number of bits of the input data row.

When the information bit is a parity bit, the value thereof is directed by the parity bit determining part 32. Accordingly, a data row in which parity bits having designated values (1 or 0) are inserted into insertion positions set in advance is generated.

In addition, when the information bit is a parity bit, the insertion position may be designated also by the parity bit determining part 32.

On the other hand, when the information bit is a DSV bit, the information bit inserting unit 11 inserts both "(1)" and "(0)" as the DSV bits. In other words, two data rows including a data row in which the DSV bit of "(1)" is inserted and a data row in which the DSV bit of "(0)" is inserted are generated.

In addition, when the information bit is a DSV bit, the value and the insertion position thereof may be designated by the DSV calculating part 41.

Although described later in detail, when the information bit is a DSV bit, the information bit is inserted into a predetermined position within a DSV control section that is a calculation target. On the other hand, when the information bit is a parity bit, the information bit is inserted into a predetermined position in a parity calculating section that is disposed after the parity calculating section that is the calculation target.

In Step S2, the data converting unit 12 performs data conversion for the data row, into which the information bits are inserted, supplied from the information bit inserting unit 11 based on the modulation table of Table 2. Accordingly, the data row is converted into a channel bit row formed of the code pattern shown in Table. 2 in units of a data pattern shown in Table. 2.

In Step S3, the synchronization signal generating unit 13 generates a synchronization signal in synchronization with the input data row based on Table 2. This synchronization signal is supplied to the data converting unit 12. The data converting unit 12 inserts the synchronization signal, which has the form of a channel bit row, supplied by the synchronization signal generating unit 13 into a predetermined position in the channel bit row.

In Step S4, the NRZI implementation unit 14 performs NRZI for the channel bit row that is supplied by the data converting unit 12. In other words, in a case where the channel bit is "1", when the prior level code is "1", the level code is "0". On the other hand, when the prior level code is "0", the level code is "1". In a case where the channel bit is "0", when the prior level code is "1", the level code is "1". On the other hand, when the prior level code is "0", the level code is "0".

In Step S5, the control section setting unit 15 performs a control section setting process. By performing this process, a predetermined section of the channel bit row is set as a control section. The length of the control section can be changed. In other words, the control section is not set in units of a predetermined number of bits.

This control section setting process will be described later in detail with reference to FIG. 4 and FIGS. 5A and 5B.

In Step S6, the control section setting unit 15 determines whether or not the control section is a DSV control section. In other words, it is determined whether the control section is a DSV control section or a parity calculating section. The determination on the section is performed based on the designation of the system or user designation. When there is no user designation, the designation is performed based on the designation of the system. On the other hand, where there is user designation, user designation has the priority, and the determination is performed based on user designation.

In other words, when determining that precise DSV control is not necessary, the user can direct to insert parity bits instead of DSV bits into all or some of the positions designated in the system as positions in which the DSV control bits are inserted.

When the control section is determined to be a DSV control section in Step S6, the DSV calculation part 41 performs DSV calculation for the DSV control section that is a control section in Step S7. In other words, two types of level code rows including a level code row that is acquired by converting the data row into which the DSV bit of "(0)" is inserted and a level code row that is acquired by converting a data row into which the DSV bit of "(1)" is inserted are input to the DSV calculating part 41. The DSV calculating part 41 compares a value calculated by adding the DSV of the DSV calculating section of one level code row to the DSV accumulated up to that point and a value calculated by adding the DSV of the DSV calculating section of the other level code row to the DSV accumulated up to that point. Then, the DSV calculating part 41 selects one added DSV that is closer to zero and sets the selected added value as a new accumulated DSV.

In Step S8, the recording code row determining part 42 determines a recording code row. In other words, the recording code row determining part 42 selects one, which is selected by the DSV calculating part 41, from between two types of the level code rows as a recording code row and outputs the recording code row.

On the other hand, in Step S6, when the control section is determined not to be a DSV control section, in other words, when the control section is determined to be a parity calculating section, the parity calculating part 31 performs parity calculation for the parity calculating section that is a control section in Step S9. Then, in Step S10, the parity calculating part 31 determines a parity bit. Described in detail, for example, the number of "1"s in the level code for the parity calculating section is counted. Then, when the number is an even number, the value of the parity bit is "(0)". On the other hand, when the number is an odd number, the value of the parity bit is "(1)". Then the parity bit having the determined value is supplied to the information bit inserting unit 11 so as to be inserted into the insertion position of the parity bit in the next parity calculating section disposed thereafter. In other words, in this embodiment, the parity bit is inserted not into the parity calculating section that is the target of the parity calculation, but into a parity calculating section that is disposed thereafter.

After the process of Step S10 is performed, the process of determining the recording code row by using the recording code row determining part 42 is performed in Step S8. In such a case, the recording code row determining part 42 directly selects the level code of the parity calculating section that is input by the NRZI implementation unit 14 as a recording code row and outputs the recording code row.

As described above, in Table 2, the parity is maintained in the relationship between the data before conversion and the code after the conversion. Accordingly, even when the value (that is, one or zero) of the information bit to be inserted into the data row is determined based on the result of calculation by using the channel bits, the DSV control and the parity control can be performed.

Next, the control section setting process represented in Step S5 of FIG. 3 will be described in detail with reference to FIG. 4 and FIGS. 5A and 5B.

Figure 4:
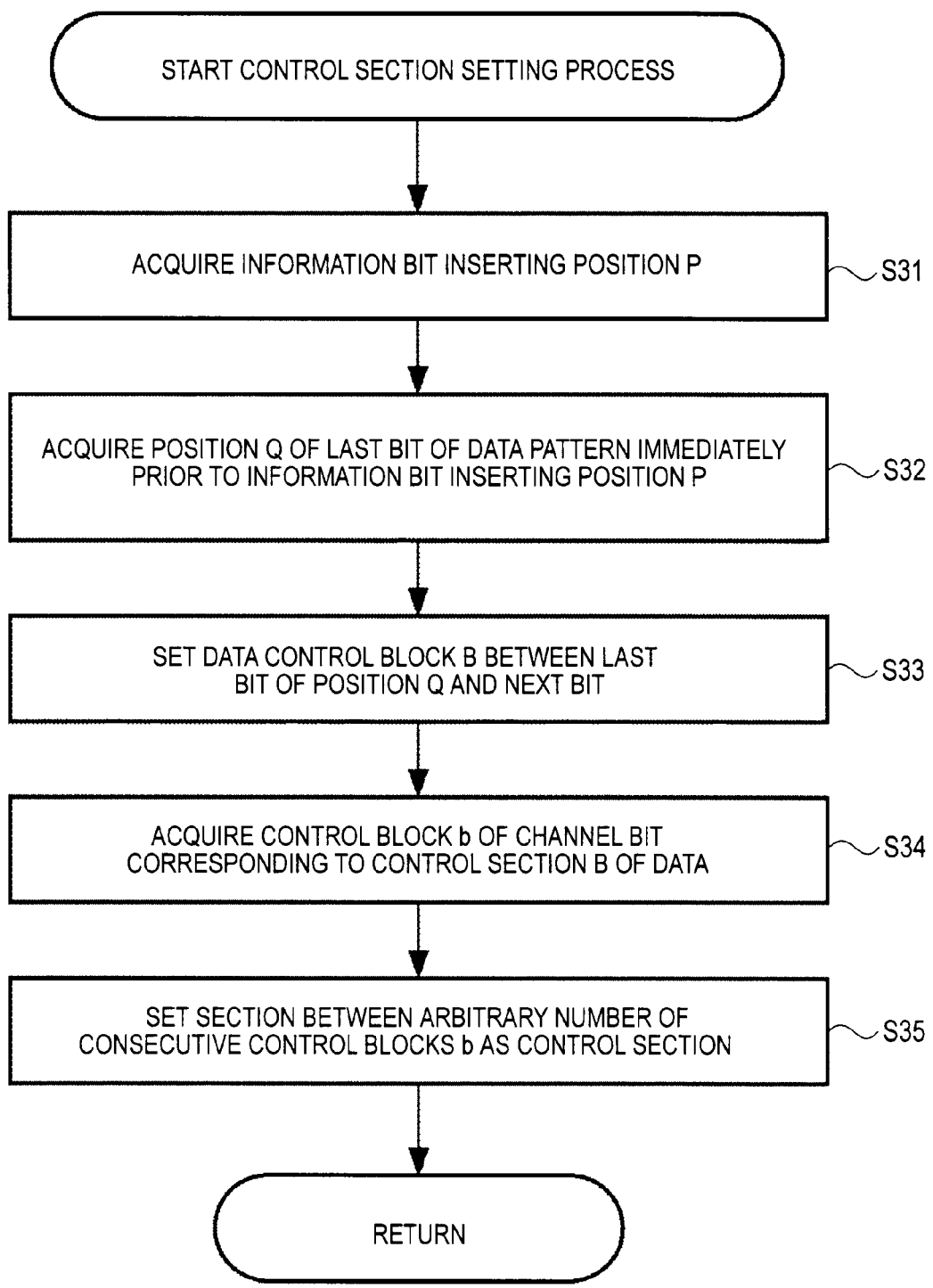
FIG. 4 is a flowchart illustrating a control section setting process.

FIG. 4 is a flowchart illustrating the control section setting process.

In Step S31, the control section setting unit 15 acquires the information bit inserting position P. In this embodiment, one information bit is inserted for every 45 bits of data. Accordingly, by counting the number of bits of data to be converted, this position P can be acquired.

In Step S32, the control section setting unit 15 acquires the position Q of the last bit of the data pattern immediately prior to the information bit inserting position P. In addition, the data pattern immediately prior to the insertion position P is assumed to be a data pattern that does not include an information bit.

In Step S33, the control section setting unit 15 sets a control block B of data between a bit located in the position Q and the next bit. In other words, the control block B is set between the last bit of the data pattern immediately prior to an information bit and the next bit with the information bit inserted into the data being used as a reference.

In Step S34, the control section setting unit 15 acquires a control block b of the channel bit corresponding to the control block B of data.

In Step S35, the control section setting unit 15 sets sections between consecutive control blocks b of an arbitrary number as control sections.

A concrete example of the control section setting process will be further described.

Figure 5A:
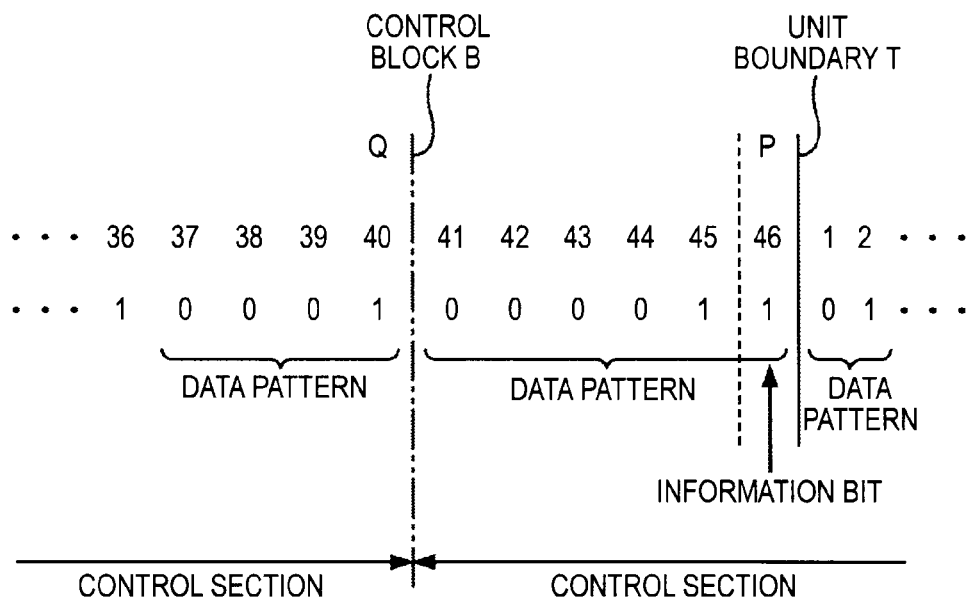
FIGS. 5A and 5B are diagrams illustrating a control section setting process.
Figure 5B:
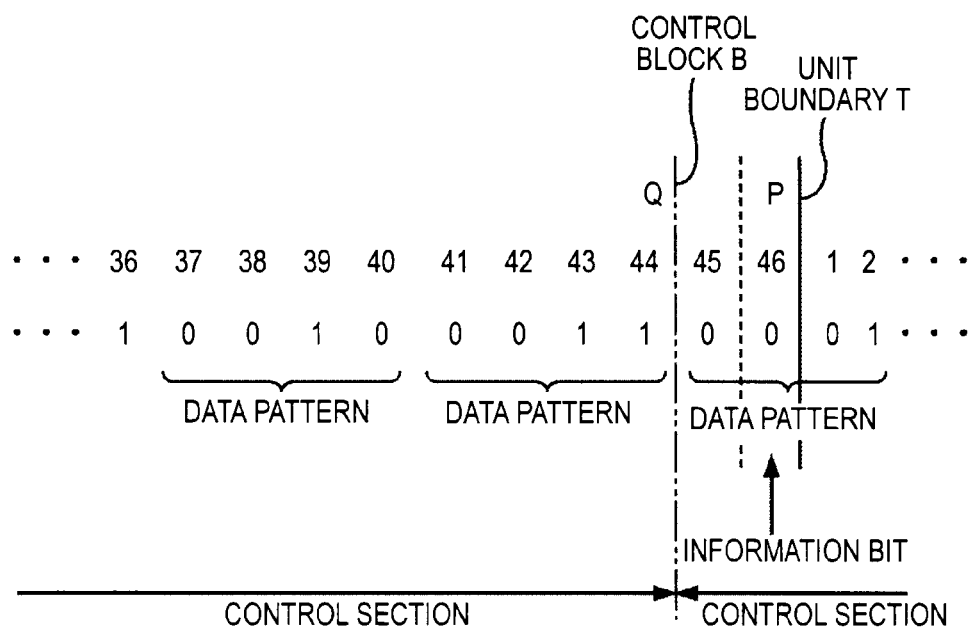

FIGS. 5A and 5B are diagrams illustrating the control section setting process. An operation of inserting one information bit for every 45 bits of data is repeated. In other words, the data row is delimited in units of 45 bits of data (45 bits), and a process of inserting one information bit immediately after 45 bits of data (the bits will be referred to as the first bit to the 45th bit) is repeated. Accordingly, the data into which the information bit is inserted, as shown in FIGS. 5A and 5B, becomes a data row in units of 46 bits delimited as a block by a unit boundary T into which an information bit is inserted in the 46th bit position P after the 45 bits of data.

As represented in Table 2, the number of bits of a data pattern is one of 2, 4, 6, and 8. In the example represented in FIG. 5A, six bits (000011) of the 41st bit to the 46th bit configure a data pattern. However, since this pattern includes the information bit of the 46th bit, this pattern is excluded from the data pattern immediately prior to the insertion position P. A 4-bit data pattern (0001) of the 37th bit to the 40th bit prior to the data pattern (000011) becomes the data pattern immediately prior to the insertion position P. Accordingly, the position Q of the last bit of the data pattern immediately prior to the insertion position P becomes the 40th bit position.

In the example represented in FIG. 5A, a control block B of data is set between the 40th bit located in the position Q and the 41st bit that is the next bit.

In the modulation table of Table 2, there are basic patterns (conversion patterns that are formed of data patterns of (11) to (000000)) that are necessary for the conversion process, substitution patterns (conversion patterns formed of data patterns of (110111), (00001000), and (00000000)) that are not necessary for the conversion process but are used for implementation of a more effective conversion process, and termination patterns (conversion patterns that are formed of data patterns of (00) and (0000)) that are used for terminating a data row at an arbitrary position.

In Table 2, a minimum run d=1, and a maximum run k=7, and an undetermined code (code represented by "*") is included as an element of the basic pattern. The undetermined code is determined to be "0" or "1" so as to maintain the minimum run d and the maximum run k regardless of an immediately prior code word row or an immediately following code word. In other words, in Table 2, when a two-data pattern to be converted is "(11)", a code pattern of "000" or "101" is selected in accordance with the immediately prior code word row (channel bit row) and is converted into the selected code pattern. For example, when one channel bit of the immediately prior code word row is "1", in order to maintain the minimum run d, the data pattern "(11)" is converted into a code pattern "000". On the other hand, when one channel bit of the immediately prior code word is "0", in order to maintain the maximum run k, the data pattern "(11)"

On the other hand, in the example represented in FIG. 5B, the data (00) of the 45th bit and the 46th bit configure a data pattern (0001) together with the data (01) of the first bit and the second bit of the next unit. Accordingly, the data pattern (0001) is not a data pattern immediately prior to the position P. The four bits (0011) of the 41st bit to the 44th bits prior to that is the data pattern immediately prior to the insertion position P. Accordingly, the position Q of the last bit of the data pattern immediately prior to the insertion position P becomes the 44th-bit position that is the last bit of the data pattern (0011).

In the example represented in FIG. 5B, a control block B of data is set between the 44th bit located in the position Q and the 45th bit that is the next bit.

In FIGS. 5A and 5B, for convenience of the description, a section between one control block B of data and another control block B is represented as a control block. In fact, a section between one control block b and another control block b is set as the control block after the data is converted into channel bits.

This control section is the parity calculating section or the DSV control section described above.

Figure 6:
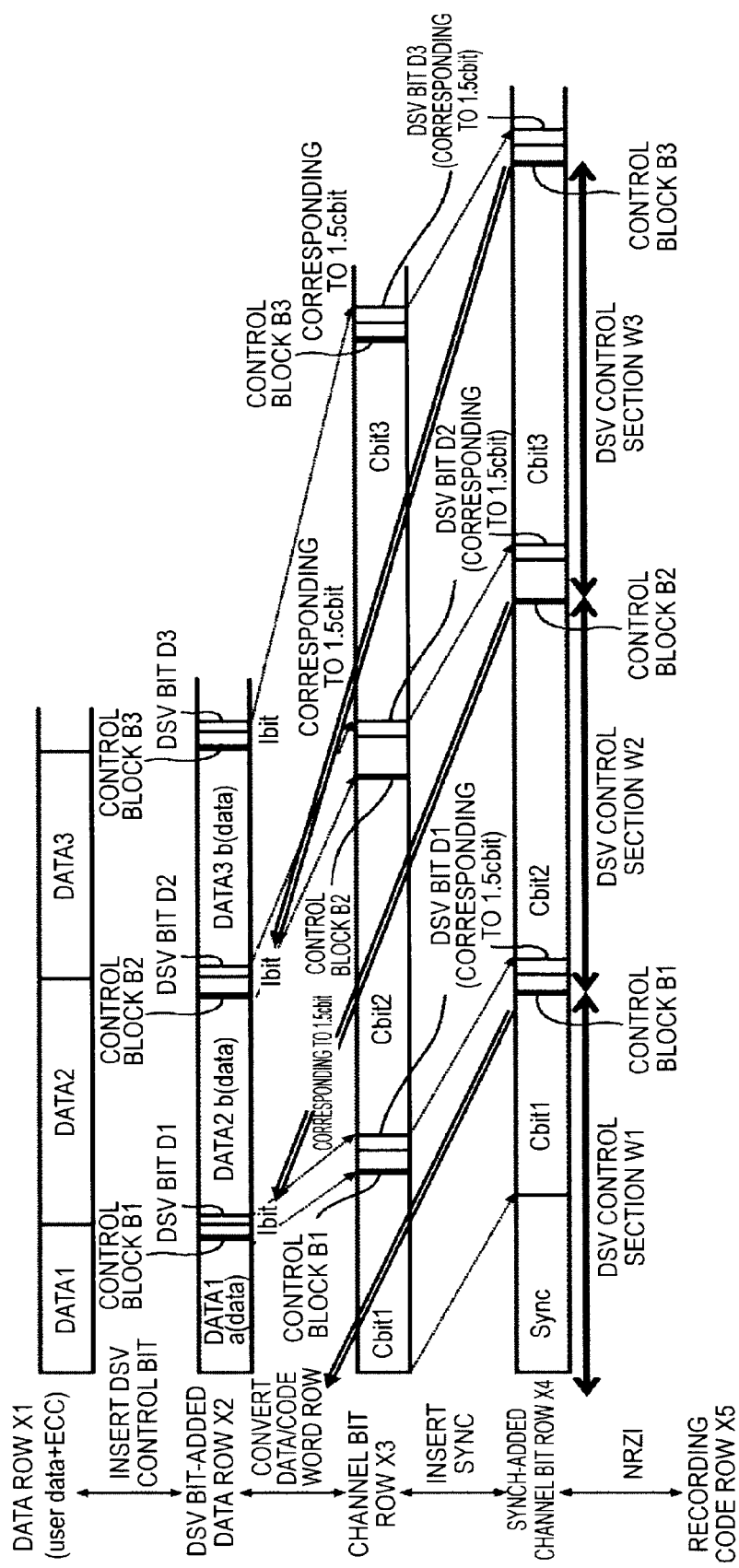
FIG. 6 is a diagram illustrating a DSV control section.

FIG. 6 is a diagram illustrating the DSV control section. In other words, FIG. 6 represents a control section in a case where all the information bits are the DSV bits.

A data row X1 represents a data row that is input to the information bit inserting unit 11 from an apparatus not shown in the figure. In this data row X1, information data such as an ECC (Error-Correcting Code) is included, in addition to user data. The information bit inserting unit 11 generates a DSV-bit added data row X2 by inserting one bit of the DSV bit D in positions of the data row X1 at a predetermined interval (in particular, for every 45 bits).

The leading section of the data row X1 is formed to have a length shorter than other sections in advance on the premise of inserting a synchronization signal (SYNC) therein. The lengths of the DSV control sections (DATA1, DATA2, and DATA3) in the data row X2 are assumed to be a data, b data, and b data. The length (c bits) of each DSV control section (DATA1, DATA2, or DATA3) of the channel bit row X3 that is generated by modulating using a modulation table in which a conversion ratio m:n of the data converting unit 12 is 2:3 is (a×3/2)=(1.5 a) or (b×3/2)=(1.5b).

The data converting unit 12 generates a sync-added channel bit row X4 by inserting a synchronization signal generated by the synchronization signal generating unit 13 into the channel bit row X3. In a predetermined position (in the example represented in FIG. 6, the leading position prior to the position of DATA1) in the sync-added channel bit row X4, a synchronization signal block (SYNC) is inserted in a channel bit form. When the number of the channel bits of the synchronization signal is c (c bits), the relationship of the following Equation (1) is satisfied among a, b, and c.

$$1.5a+c=1.5b \quad (1)$$

Accordingly, also in the format including the synchronization signal, the DSV control is performed at the same interval.

The DSV bit, which is one-bit data, corresponds to 1.5 channel bits within the channel bits. In other words, the DSV bit inserted into the data row as one bit increases in the channel bits by the amount corresponding to the conversion ratio as described below.

$$1 \text{ bit} \times n/m = 1 \times 3/2 = 1.5 \text{ channel bits} \quad (2)$$

The control block B is close to the unit boundary T that is the boundary of units for inserting the information bit (for the case of FIG. 6, the DSV bit D) but is located in a position different from that of the unit boundary T.

Here, based on the characteristics of Table 2, which is a variable-length table used here, by selecting a case where "(0)" is given to the DSV bit or a case where "(1)" is given to the DSV bit, the DSV control can be performed well.

A section between a control block B and another control block B is a DSV control section W. This DSV control section W is supplied from the control section setting unit 15 to the DSV calculating part 41. In the example represented in FIG. 6, a section between a control block B0 (not shown) and the next control block B1 is a DSV control section W1, and a section between a control block B1 and the next control block B2 is a DSV control section W2. In addition, a section between the control block B2 and the next control block B3 is a DSV control section W3. A DSV bit is disposed within the DSV control section that is a calculation target. For example, a DSV that is acquired by performing DSV calculation for the DSV control section W2 is disposed within the DSV control section W2 as a DSV bit D1. In addition, a DSV that is acquired by performing DSV calculation for the DSV control section W3 is disposed within the DSV control section W3 as a DSV bit D2.

As for the DSV bit, only one bit is included in the DSV control section. Accordingly, the DSV control can be performed well.

In addition, the DSV control section may be configured as a fixed value. In such a case, for example, a position that is 10 bits of data prior to the position of an information bit is designated as a control block B of each section. In other words, a control block B is set right after a bit that is positioned a predetermined number of bits prior to the information bit by using the information bit inserted into the data as a reference. Since the variable-length conversion is performed, there is mismatching after the conversion. However, by allowing the information on the basis of the channel bits positioned after the fixed block to be included in the next section, the DSV control can be performed.

Figure 7:
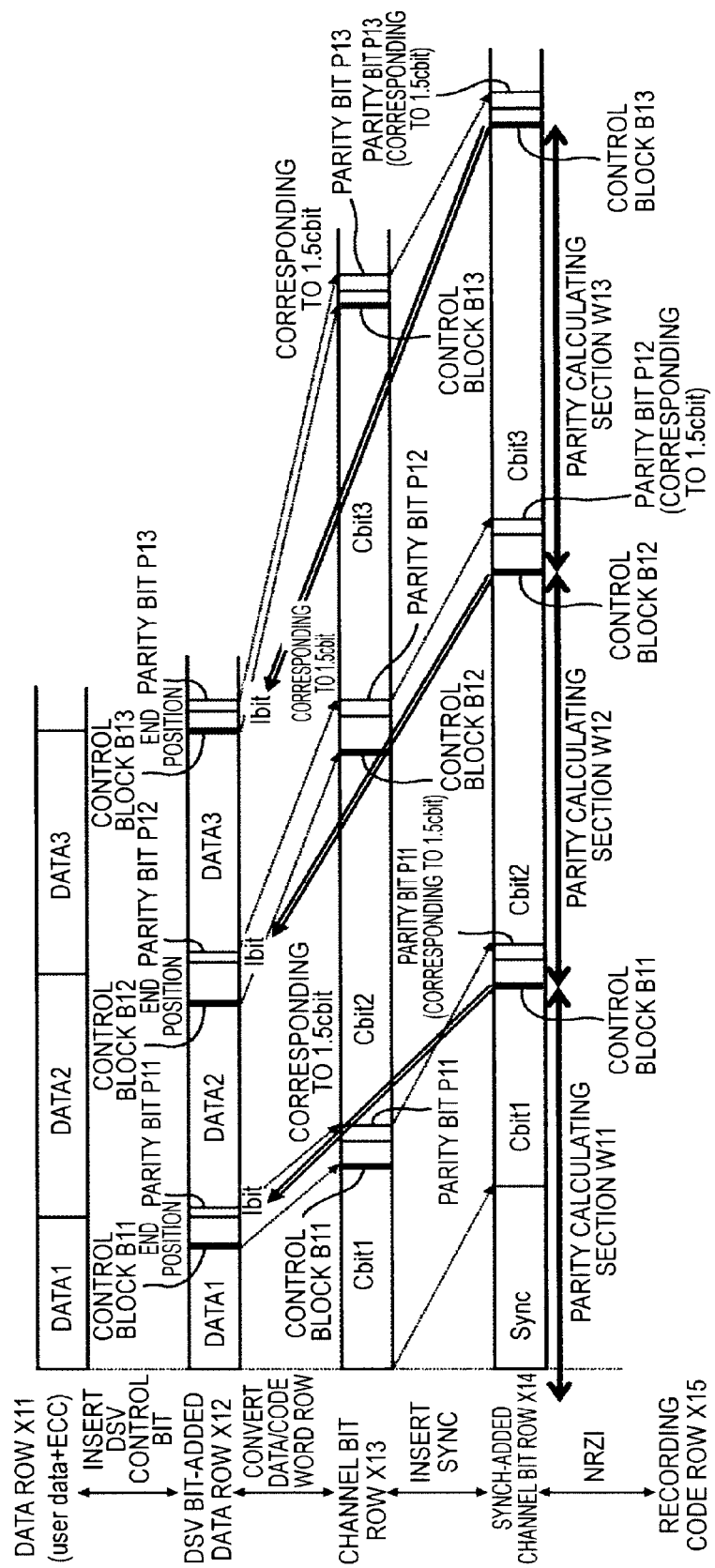
FIG. 7 is a diagram illustrating a parity calculating section.

FIG. 7 is a diagram illustrating a parity calculating section. In other words, FIG. 7 represents a control section in a case where all the information bits are parity bits.

A section between a control block B and another control block B is a parity calculating section W. This parity calculating section W is supplied from the control section setting unit 15 to the parity V calculating part 31. In the example represented in FIG. 7, a section between a control block B10 (not shown) and the next control block B11 is a parity calculating section W11, and a section between a control block B11 and the next control block B12 is a parity calculating section W12. In addition, a section between the control block B12 and the next control block B13 is a parity calculating section W13.

A parity bit is disposed outside the parity calculating section that is a calculation target. For example, a parity bit that is acquired by performing parity calculation for the parity calculating section W11 is disposed within a parity calculating section W12 that is positioned outside the parity calculating section W11 as a parity bit P11 and is positioned after the parity calculating section W11. In addition, a parity bit that is acquired by performing parity calculation for the parity calculating section W12 is disposed within a parity calculating section W13 that is positioned outside the parity calculating section W12 as a parity bit P12 and is positioned after the parity calculating section W12.

Figure 8:
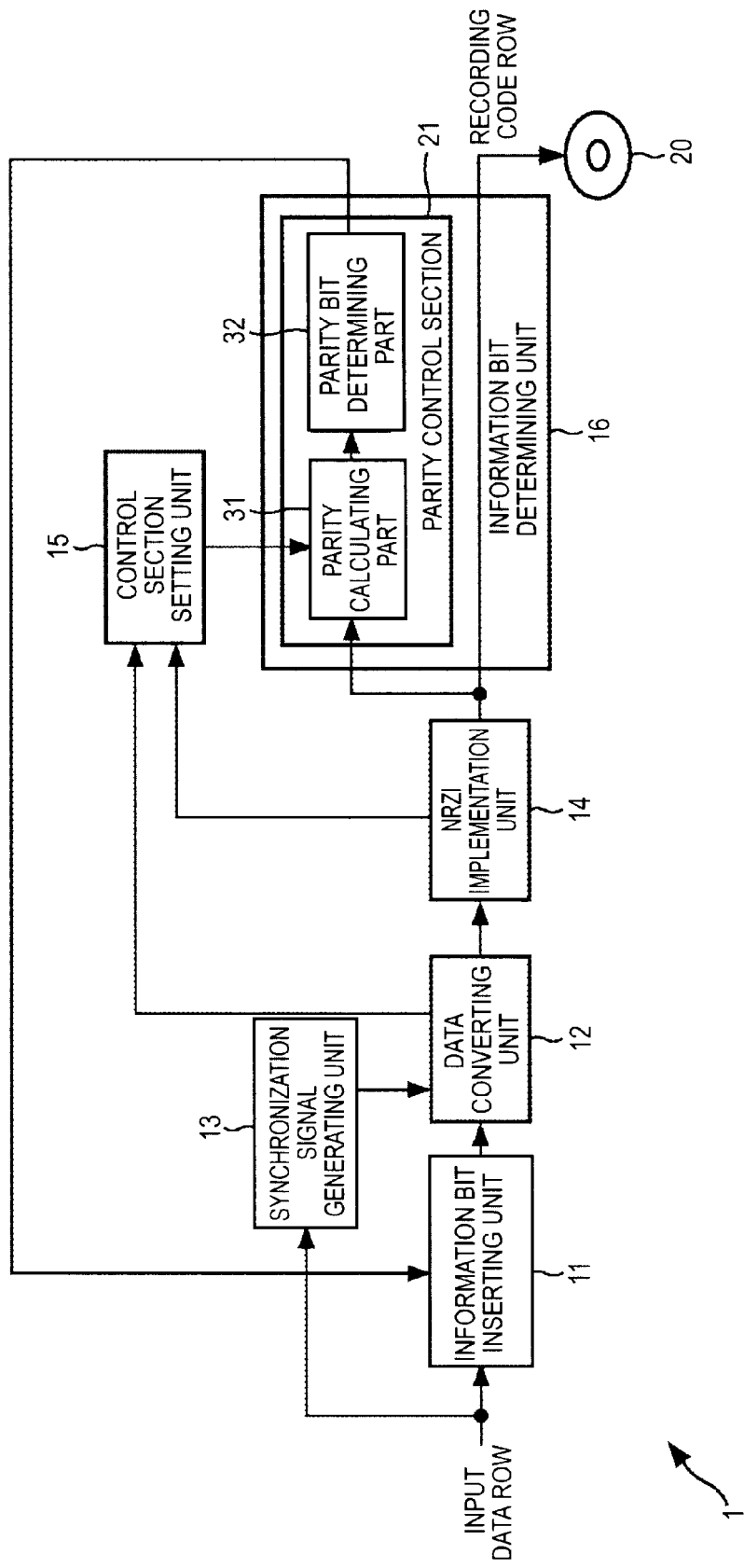
FIG. 8 is a block diagram representing the configuration of a data modulation apparatus according to an embodiment of the invention.

As represented in FIG. 7, in a case where only the parity calculation is performed, the data modulation apparatus 1 is configured as shown in FIG. 8. As is apparent by comparing FIG. 7 to FIG. 2, the data modulation apparatus 1 shown in FIG. 7 has a configuration in which the DSV control section 22 of the data modulation apparatus 1 shown in FIG. 2 is omitted.

Figure 9:
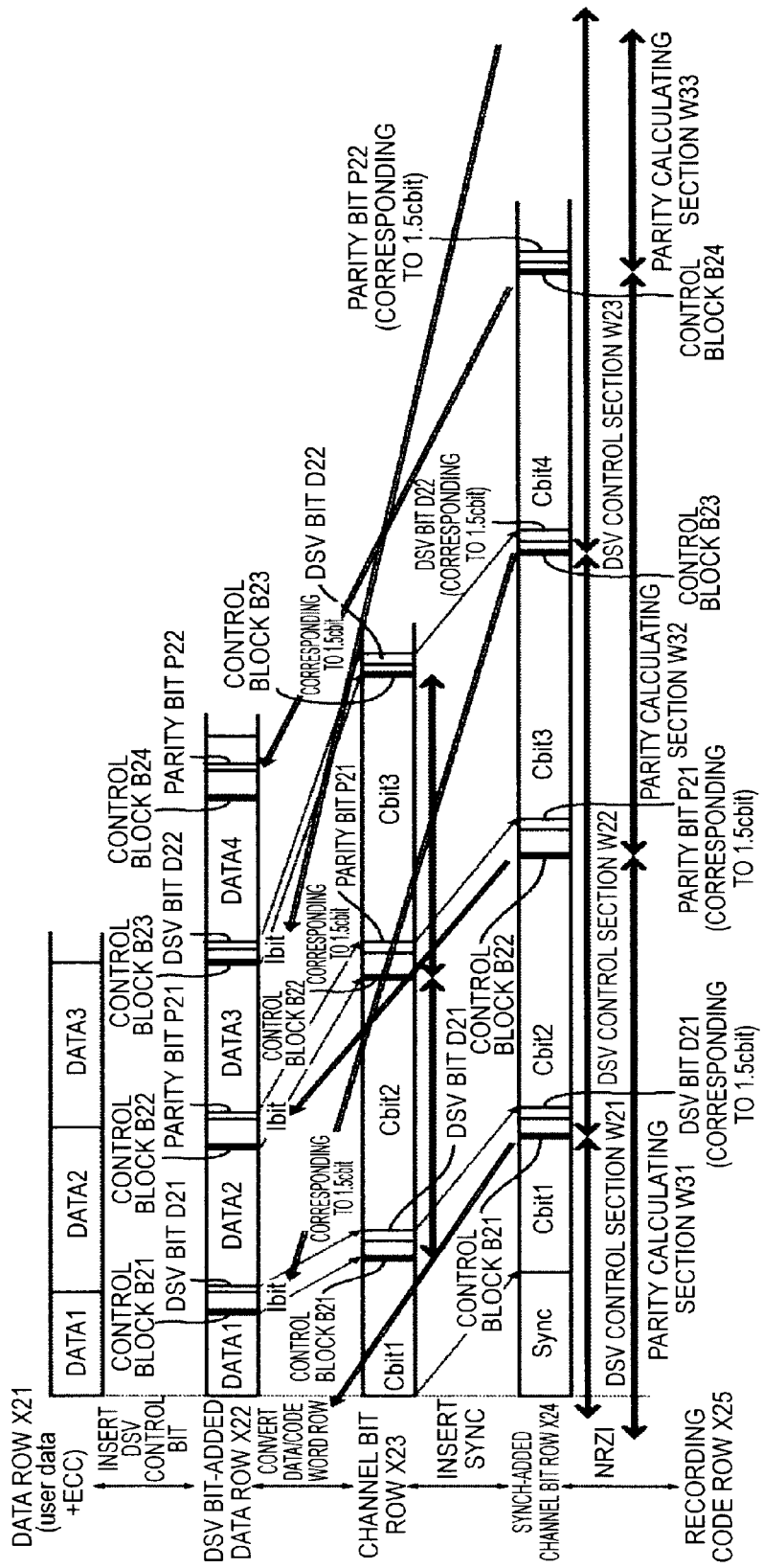
FIG. 9 is a diagram illustrating a DSV control section and a parity calculating section.

FIG. 9 is a diagram illustrating a DSV control section and a parity calculating section. In other words, FIG. 9 represents a control section in a case where some of the information bits are configured as parity bits, and those remaining are maintained to be the DSV bits.

In the example of FIG. 9, consecutive control blocks B are selected every other block, and a section between the selected blocks becomes a DSV control section. In addition, similarly, other control blocks B are selected every other block, and a section between the selected blocks becomes a parity calculating section.

In other words, in the example represented in FIG. 9, a section between a control block B21 and a further next control block B23 with the next control block B22 being skipped becomes a DSV control section W22. In addition, a section between a control block B23 and a further next control block B25 (not shown) with the next control block B24 being skipped becomes the next DSV control section W23. This DSV control section W is supplied from the control section setting unit 15 to the DSV calculating part 41.

In addition, a section between a control block B20 (not shown) and the further next control block B22 with the next control block B21 being skipped becomes a parity calculating section W31. A section between the control block B22 and the further next control block B24 with the next control block B23 being skipped becomes the next parity calculating section W32. This parity calculating control section W is supplied from the control section setting unit 15 to the parity calculating part 31.

A DSV bit is disposed within the DSV control section that is a calculation target. For example, a DSV that is acquired by performing DSV calculation for the DSV control section W22 as the target is disposed within the DSV control section W22 as a DSV bit D21. In addition, a DSV that is acquired by performing DSV calculation for the DSV control section W23 as the target is disposed within the DSV control section W23 as a DSV bit D22.

On the other hand, a parity bit is disposed outside the parity calculating section that is a calculation target. For example, a parity bit that is acquired by performing parity calculation for the parity calculating section W31 as the target is disposed within a parity calculating section W32 that is positioned outside the parity calculating section W31 as a parity bit P21 and is positioned after the parity calculating section W31. In addition, a parity bit that is acquired by performing parity calculation for the parity calculating section W32 as the target is disposed within a parity calculating section W33 that is positioned outside the parity calculating section W32 as a parity bit P22 and is positioned after the parity calculating section W32.

In the example represented in FIG. 9, the DSV control section and the parity calculating section are set so as not to overlap with each other.

Figure 10:
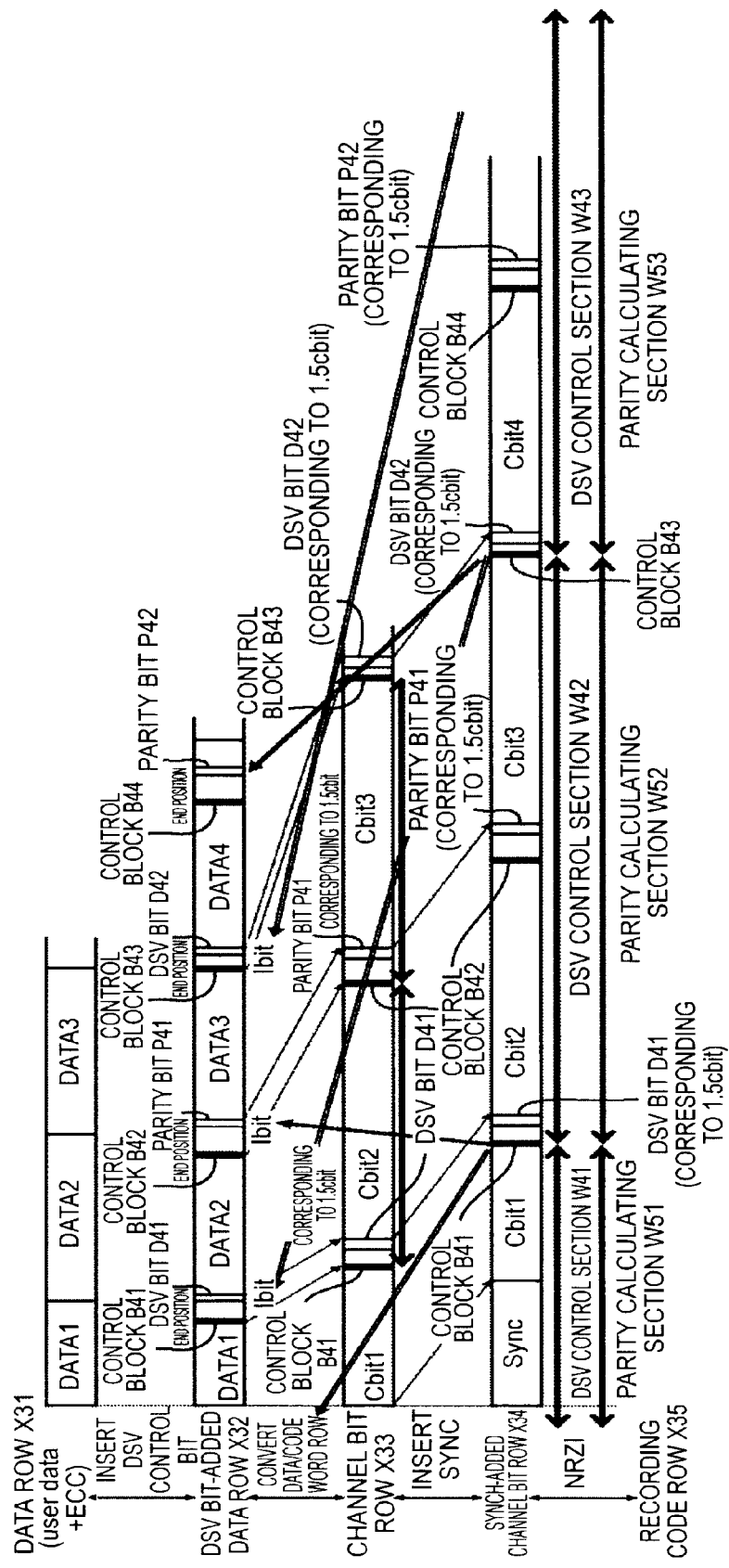
FIG. 10 is a diagram illustrating a DSV control section and a parity calculating section.

FIG. 10 is a diagram illustrating the DSV control section and the parity calculating section. In other words, FIG. 10, similarly to FIG. 9, represents a control section in a case where some of the information bits are configured as parity bits, and those remaining are configured as the DSV bits.

In the example of FIG. 10, consecutive control blocks B are selected every other block, and a section between the selected blocks is configured as a DSV control section and is also configured as a parity calculating section. In the example of FIG. 10, a section between a control block B41 and a further next control block B43 with the next control block B42 being skipped is configured as a DSV control section W42 and is also configured as a parity calculating section W52. In addition, a section between a control block B43 and a further next control block B45 (not shown) with the next control block B44 being skipped is configured as the next DSV control section W43 and is also configured as a parity calculating section W53. This DSV control section W is supplied from the control section setting unit 15 to the DSV calculating part 41, and the parity calculating section W is supplied from the control section setting unit 15 to the parity calculating part 31.

A DSV bit is disposed within the DSV control section that is a calculation target. For example, a DSV that is acquired by performing DSV calculation for the DSV control section W42 as the target is disposed within the DSV control section W42 as a DSV bit D41. In addition, a DSV that is acquired by performing DSV calculation for the DSV control section W43 as the target is disposed within the DSV control section W43 as a DSV bit D42.

On the other hand, a parity bit is disposed outside the parity calculating section that is a calculation target. For example, a parity bit that is acquired by performing parity calculation for the parity calculating section W51 as the target is disposed within a parity calculating section W52 that is positioned outside the parity calculating section W51 as a parity bit P41 and is positioned after the parity calculating section W51. In addition, a parity bit that is acquired by performing parity calculation for the parity calculating section W52 as the target is disposed within a parity calculating section W53 that is positioned outside the parity calculating section W52 as a parity bit P42 and is positioned after the parity calculating section W52.

In the example represented in FIG. 10, the DSV control section and the parity calculating section are set so as to overlap with each other.

In the example of FIG. 10, the insertion position of the parity bit in the parity calculating section as a calculation target is disposed on the backward side relative to the case of FIG. 9.

When the method represented in FIG. 10 is used, the DSV control section W and the parity calculating section W are set with the same control block B used as the reference. Accordingly, the configuration of hardware can be simplified.

In the example represented in FIG. 10, the control block B adjacent to the DSV bit D is used as the block of the control section. However, the control section may be set by using the control block B adjacent to the parity bit P as the block.

By employing the above-described configuration, the recording code row can be generated by using a table as shown in Table 2. In a case where disposition of the DSV bits at a predetermined interval is predetermined as a system format, when suppression of a DC component is not necessary, by performing recording with a parity bit buried in the insertion position of the DSV bit instead of the DSV bit, error correction can be made more reliably. Accordingly, recording and reproducing of data can be performed more effectively.

In addition, even in a case where suppression of the DC component is necessary, when the suppression of the DC component is not necessary to the degree at which disposition of the DSV bits is predetermined as a system format, the DSV bits disposed at a predetermined interval can be partially replaced with parity bits. By performing recording as described above, the error correction can be made more reliably. Accordingly, recording and reproducing of data can be performed more effectively.

In other words, a system using a predetermined format of which the recording and reproducing characteristics are more stable can be implemented.

All or some of the DSV bits are only replaced with parity bits. Accordingly, even in a case where a system that reproduces a recording medium recorded according to this embodiment does not support, for example, a parity bit-buried format, error does not occur. In other words, a reproduction process having compatibility can be performed.

Figure 11:
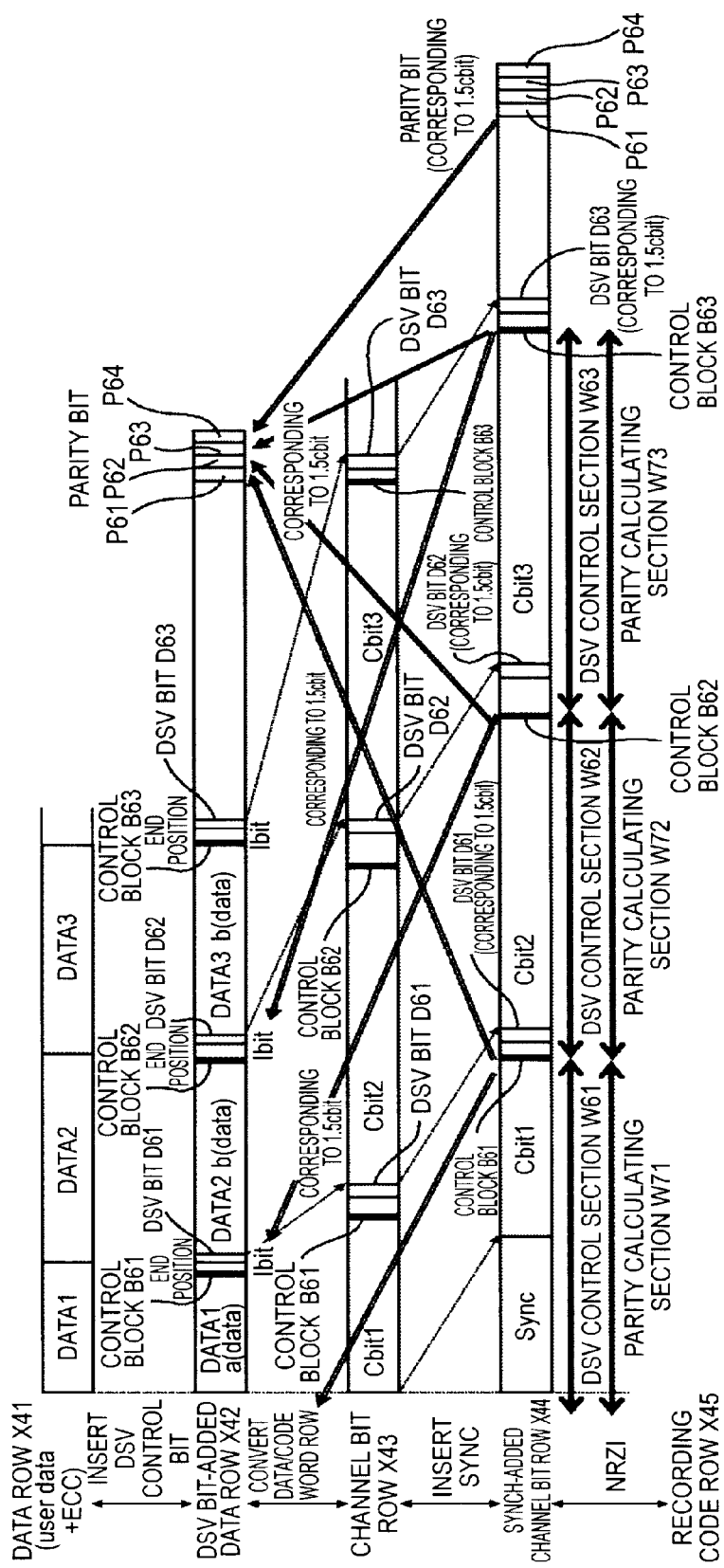
FIG. 11 is a diagram illustrating a DSV control section and a parity calculating section.

FIG. 11 is a diagram illustrating another DSV control section and parity calculating section.

In the example of FIG. 11, a section between a control block B and the next control block B is configured as a DSV control section, and the same section is configured as a parity calculating section. In the example of FIG. 11, a section between a control block B61 and the next control block B62 is configured as a DSV control section W62 and is also configured as a parity calculating section W72. In addition, a section between a control block B62 and the next control block B63 is configured as a DSV control section W63 and is also configured as a parity calculating section W73. This DSV control section W is supplied from the control section setting unit 15 to the DSV calculating part 41, and the parity calculating section W is supplied from the control section setting unit 15 to the parity calculating part 31.

A DSV bit is disposed within the DSV control section that is a calculation target. For example, a DSV that is acquired by performing DSV calculation for the DSV control section W62 as the target is disposed within the DSV control section W62 as a DSV bit D61. In addition, a DSV that is acquired by performing DSV calculation for the DSV control section W63 as the target is disposed within the DSV control section W63 as a DSV bit D62.

On the other hand, the parity bits are collectively arranged outside the parity calculating sections as targets. For example, the parity bits P61, P62, P63, and the like that are acquired by performing parity calculation for the parity calculating sections W71, W72, and W73 as targets are collectively arranged at the end of the data row.

In the example of FIG. 11, the DSV control section W and the parity calculating section W are set so as to overlap with each other.

The other configurations represented in FIG. 11 are the same as those of the example of FIG. 10.

2. Second Embodiment

[Configuration of Data Modulation Apparatus]

Figure 12:
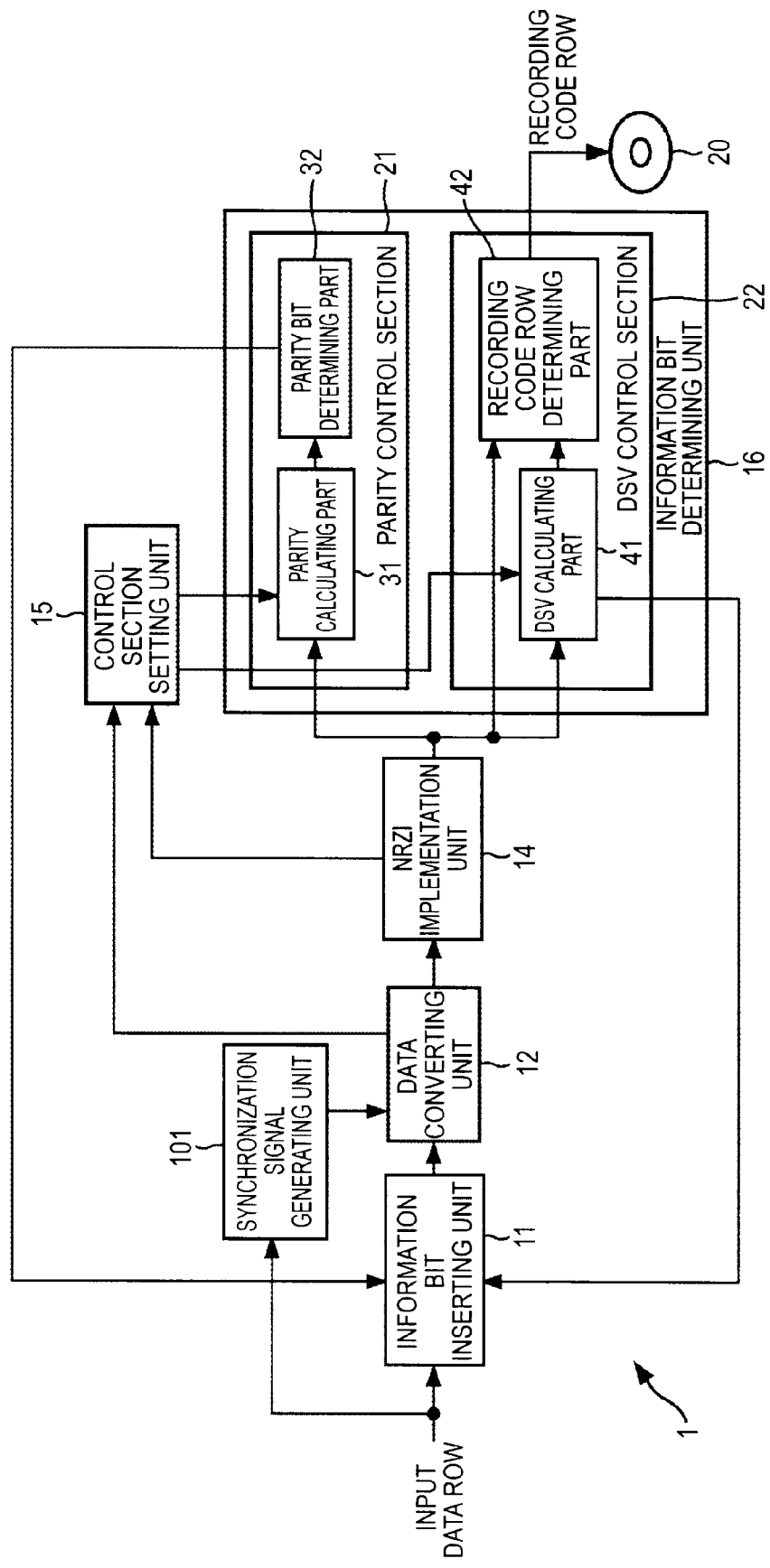
FIG. 12 is a block diagram representing the configuration of a data modulation apparatus according to another embodiment of the present invention.

FIG. 12 is a block diagram representing the configuration of a data modulation apparatus according to another embodiment.

This embodiment is different from the embodiment represented in FIG. 2 in that a synchronization signal generating unit 101 is disposed instead of the synchronization signal generating unit 13 shown in FIG. 2.

The synchronization signal generating unit 101 shown in FIG. 12 allows additional information to be included and then generates the synchronization signal.

The synchronization signal generated by the synchronization signal generating unit 101 is assumed to have 30 channel bits. 24 channel bits out of 30 channel bits are as follows. These 24 channel bits are the same as the synchronization signal shown in Table 2.

01 001 000 000 001 000 000 001 (24 channel bits)
=0 not terminate case
=1 terminate case The synchronization signal generating unit 101 has 30 bits, and 6 channel bits are added to the above-described 24 channel bits. By using these 6 channel bits, information indicating replacement of all or some of the DSV bits with parity bits can be described. Alternatively, by using these 6 channel bits, the parity bits can be described.

By using the above-described additional information, for example, the configuration of the DSV bits and the parity bits having a more complicated sequence described as below can be implemented.

DSV Bit-Parity Bit-Parity Bit-DSV Bit-Parity Bit-Parity Bit-DSV bit . . .

In such a case, a rule can be determined in advance on encoder (data modulation apparatus) and decoder (data demodulation apparatus) sides.

In addition, by using the above-described additional information, a specific pattern can be applied as a technique regarding the control block. For example, as described above, a control block B can be set right after a bit that is positioned a predetermined number of bits prior to an information bit by using the information bit inserted into the data as a reference. In such a case, information based on channel bits positioned after a fixed block can be used as the additional information. Accordingly, a recording and reproducing process can be performed more reliably.

As described above, information different from ordinary information can be added whilst obeying the rule of Table 2.

The other configurations and operations represented in FIG. 12 are the same as those of the embodiment represented in FIG. 2. Thus, the description thereof, which would be a duplicate, is omitted.

[Verification Result]

The result of verifying the recording and reproducing by using the variable-length table shown in FIG. 2 is represented as below.

According to Table 2 that limits the continuation of the minimum inversion interval Tmin and converts a data row into which information bits are inserted within a data row by using a variable-length table, the number of times of continuation of the minimum inversion interval Tmin is limited to up to 6 times based on a plurality of minimum run continuation limiting tables. In the simulation, the results and peak DSVs of cases including: (1) a case where only the DSV bit is interposed as the buried information bit; (2) a case where only a parity information bit is interposed as the buried information bit; and (3) a case where a DSV bit and a parity information bit are alternately interposed as the buried information bits; are represented by using Table 2.

In random data (634,880-bit data) that was arbitrarily generated, an information bit of one bit was inserted for each 45 bits of the data in consideration of the synchronization signals, and then various control processes were performed for the data so as to be converted into a code word row (channel bit row) by using the above-described technique. In addition, the synchronization signals (including 9T to 9T) were inserted at the interval of 1240-bit data corresponding to the data row. The number of the synchronization signals inserted at this time is 512 (=634,880/1,240). The synchronization signal has 30 channel bits, and the last 6 channel bits can be assigned as an identification pattern. By disposing such identification patterns in predetermined positions, the identification patterns can be used for identifying the positions.

The result for the case where the data is converted into the above-described code word row (channel bit row) is as follows.

The values of the results were calculated as below.

Ren_cnt[1 to 7]: Number of occurrences of first-time to seventh-time repetition of the minimum run T_size[2 to 10]: Number of occurrences of each run of 2T to 10T Sum: Number of bits (Total number of bits)

Total: Number of run lengths (Total number of occurrences of each run (2T, 3T, . . . ))

Average Run: (Sum/Total)

Value of Run Distribution: (T_size[i]×(i))/(Sum) (here, i=2, 3, 4, . . . , 10) (The values represented in the fields of 2T to 10T of Table 3 represent the values of the run distribution.)

Value of Distribution in which Tmin is continuous: (Ren_cnt[i]×(i))/T_size[2T]) (here, i=1, 2, 3, 4, . . . , 7) (values represented in the fields of RMTR (1) to RMTR (7) of Table 3 represent the values of the distribution in which the minimum run is continuous)

max-RMTR: Maximum number of times of repetition of the minimum run peak DSV: Positive Peak and Negative Peak of DSV value for a case where the DSV value is calculated in the process of performing the DSV control for the code word row DSV: DSV value at the final end of the code word row (it corresponds to a difference between the numbers of "1" and "0" in the code word row)

Here, (1), (2), and (3) in Table 3 correspond to examples of FIG. 6 (a case where only the DSV bit is used), FIG. 7 (a case where all the DSV bits are substituted with the parity bits), and FIG. 9 (a case where a half of the DSV bits are substituted with parity bits).

TABLE 3

|  | (1) DSV | (2) parity | (3) DSV + parity |
|---|---|---|---|
| Parity Control | No | Yes | Yes |
| Average Run | 3.381 | 3.384 | 3.384 |
| Sum | 989184 | 989184 | 989184 |
| Total | 292565 | 292291 | 292334 |
| 2T | 0.224 | 0.224 | 0.224 |
| 3T | 0.220 | 0.220 | 0.220 |
| 4T | 0.193 | 0.192 | 0.192 |
| 5T | 0.150 | 0.149 | 0.150 |
| 6T | 0.108 | 0.109 | 0.109 |
| 7T | 0.057 | 0.057 | 0.057 |
| 8T | 0.038 | 0.039 | 0.039 |
| 9T | 0.009 (1024) | 0.009 (1024) | 0.009 (1024) |
| 10T | 0.000 | 0.000 | 0.000 |
| RMTR (1) | 0.384 | 0.387 | 0.387 |
| RMTR (2) | 0.315 | 0.313 | 0.312 |
| RMTR (3) | 0.172 | 0.172 | 0.172 |
| RMTR (4) | 0.092 | 0.091 | 0.091 |
| RMTR (5) | 0.030 | 0.030 | 0.030 |
| RMTR (6) | 0.008 | 0.008 | 0.008 |
| RMTR (7) | 0.000 | 0.000 | 0.000 |
| max-RMTR | 6 | 6 | 6 |
| peak DSV | −30 to +26 | −1460 to +136 | −66 to +80 |
| DSV | −6 | −990 | 0 |

In the result shown in Table 3, the number of occurrences of the maximum run 9T is 1024, which coincides with inclusion of 9T to 9T in 512 synchronization signals. In addition, it is checked that the minimum run d=1 and the maximum run k=7, which are parameters of Table 2, and limitation of continuation of the minimum run up to six times, and based on the result of the peak DSV, DSV control is represented to be performed within the data row in results (1) and (3) (the value of the peak DSV is included within a predetermined range).

In the result (2) (the example represented in FIG. 7), there are parity bits only, and it can be known that the DSV control is not performed. In other words, the peak DSV is large as being −1460 to +136. In addition, in the result (3) (the example represented in FIG. 9), although the DSV control is performed, the interval for performing the DSV control is twice of that of the case of the result (1) (the example of FIG. 6). Accordingly, the peak DSV is −66 to +80, which is larger than −30 to +26 of the case of the result (1) (the example of FIG. 6). In other words, performance of the DSV control deteriorates more than the case of the result (1) (the example of FIG. 6), but the DSV control is performed, which is different from the case of the result (2) (the example of FIG. 7).

In addition, in the case of the result (1) (the example of FIG. 6), there is no parity bit, and the parity control is not performed. However, in the cases of the result (2) (the example of FIG. 7) and the result (3) (the example of FIG. 9), there are parity bits, and thus the parity control is performed. As a result, occurrence of error in the data recording and reproducing can be decreased, and accordingly, a more stable system can be provided.

In particular, in a system in which the DSV control is not necessary for a predetermined format that much, additional information can be provided at the time of data reproduction by substituting some of the DSV bits used for the DSV control with parity bits. Accordingly, by using the additional information, the recording and reproducing characteristics can be further stabilized.

An embodiment of the present invention can be applied to a Blu-ray disc recorder or other apparatuses that record data on a recording medium.

The series of processes described above can be performed by hardware or software. In a case where the series of the processes is performed by the software, programs configuring the software are installed to a computer. Here, the computer includes a computer that is built in dedicated hardware, a computer such as a general personal computer that can perform various functions by installing various programs therein, and the like.

FIG. 13 is a block diagram representing a configuration example of hardware of a computer that performs the above-described series of processes based on a program.

In the computer, a CPU (Central Processing Unit) 201, a ROM (Read Only Memory) 202, and a RAM (Random Access Memory) 203 are interconnected through a bus 204.

In addition, an input/output interface 205 is connected to the bus 204. To the input/output interface 205, an input unit 206, an output unit 207, a memory unit 208, a communication unit 209, and a drive 210 are connected.

The input unit 206 is configured by a keyboard, a mouse, a microphone, or the like. The output unit 207 is configured by a display, a speaker, or the like. The memory unit 208 is configured by a hard disk, a non-volatile memory, or the like. The communication unit 209 is configured by a network interface or the like. The drive 210 drives a removable media 211 such as a magnetic disk, an optical disc, a magneto optical disc, or a semiconductor memory.

In the computer configured as described above, the CPU 201, for example, performs the above-described series of processes by loading a program that is stored in the memory unit 208 into the RAM 203 through the input/output interface 205 and the bus 204 and executing the program.

The program executed by the computer (CPU 201), for example, may be provided by being recorded on the removable medium 211 as a package medium or the like. In addition, the program may be provided through a wired or wireless transmission medium such as a local area network, the Internet, or a digital satellite broadcast.

In the computer, a program may be installed to the memory unit 208 through the input/output interface 205 by loading the removable medium 211 into the drive 210. In addition, a program may be installed to the memory unit 208 by receiving the program by using the communication unit 209 through a wired or wireless transmission medium. Alternatively, the program may be installed to the ROM 202 or the memory unit 208 in advance.

The program executed by the computer may be a program that performs the processes in a time series in accordance with the sequence described here, a program that performs the processes in a parallel manner, or a program that performs the process at a necessary timing such as a called timing.

An embodiment of the present invention is not limited to the embodiments described above and may be variously changed in the scope not departing from the concept of the invention.

The present application contains subject matter related to that disclosed in Japanese Priority Patent Applications JP 2009-237553 filed in the Japan Patent Office on Oct. 14, 2009, the entire contents of which is hereby incorporated by reference.

What is claimed is:

1. A data modulation apparatus comprising:
   insertion means for inserting information bits into data at a predetermined interval;
   conversion means for converting the data into which the information bits are inserted into an RLL code based on a modulation table that has a variable-length conversion rule;
   setting means for setting a control section that is used for calculating a value of the information bit; and
   determination means for determining the value of the information bit inserted into the control section that is different from a calculation target by calculating the code of the control section.

2. The data modulation apparatus according to claim 1, wherein the setting means sets a block of the control section between a last bit of a data pattern immediately prior to the information bit and a next bit with the information bit inserted into the data used as a reference.

3. The data modulation apparatus according to claim 1, wherein the insertion means inserts the information bit having the value calculated based on the code of the control section that becomes a calculation target into the control section that is positioned on the backward side of the control section that becomes a calculation target.

4. The data modulation apparatus according to claim 3,
   wherein the setting means sets a DSV control section and a parity calculating section as the control section that becomes the calculation target,
   wherein the determination means calculates a DSV based on the code of the DSV control section that becomes a calculation target as the information bit and calculates parity of the parity calculating section that becomes a calculation target as the information bit, and
   wherein the insertion means inserts the information bit of the DSV calculated based on the code of the DSV control section that becomes the calculation target into the DSV control section that becomes a calculation target and inserts the information bit of the parity of the parity calculating section that becomes the calculation target into the parity calculating section that is positioned on the backward side of the parity calculating section that becomes the calculation target.

5. The data modulation apparatus according to claim 4, wherein the parity calculating section and the DSV control section are sections different from each other.

6. The data modulation apparatus according to claim 4, wherein the insertion means inserts identification information that indicates insertion of the information bit into a synchronization signal.

7. The data modulation apparatus according to claim 4, wherein the RLL code having the variable-length rule has a parity conserving pattern in the relationship between the data before conversion and the code after the conversion.

8. The data modulation apparatus according to claim 7, wherein the table of the RLL code having the variable-length rule has a minimum run d=1, a maximum run k=7, a basic data length m=2, and a basic code word length n=3 and has a rule in which continuation of the minimum run is limited to a predetermined limited number of times or less as the conversion rule.

9. The data modulation apparatus according to claim 1, wherein the setting means sets a block immediately after a bit positioned a predetermined number of bits prior to the information bit with the information bit inserted into the data used as a reference.

10. A data modulation method of a data modulation apparatus that includes insertion means, conversion means, setting means, and determination means, the data modulation method comprising the steps of:
    inserting information bits into data at a predetermined interval by using the insertion means;
    converting the data into which the information bits are inserted into an RLL code based on a modulation table that has a variable-length conversion rule by using the conversion means;

setting a control section that is used for calculating a value of the information bit by using the setting means; and determining the value of the information bit inserted into the control section that is different from a calculation target by calculating the code of the control section by using the determination means.

11. A recording medium that is recorded by using a channel bit that is modulated in accordance with the data modulation method according to claim 10.

12. A program embodied on a non-transitory computer readable storage medium that causes a computer to serve as insertion means, conversion means, setting means, and determination means, wherein the insertion means inserts information bits into data at a predetermined interval, wherein the conversion means converts the data into which the information bits are inserted into an RLL code based on a modulation table that has a variable-length conversion rule, wherein the setting means sets a control section that is used for calculating a value of the information bit, and wherein determination means determines the value of the information bit inserted into the control section that is different from a calculation target by calculating the code of the control section.

13. A data modulation apparatus comprising:

insertion means for inserting information bits into data at a predetermined interval;

conversion means for converting the data into which the information bits are inserted into an RLL code based on a modulation table that has a variable-length conversion rule;

setting means for setting a control section that is used for calculating a value of the information bit; and determination means for determining the value of the information bit inserted into the control section by calculating the code of the control section, wherein the insertion means inserts identification information relating to a position of a block of the control section into a synchronization signal.

14. A data modulation method of a data modulation apparatus comprising:

insertion means for inserting information bits into data at a predetermined interval;

conversion means for converting the data into which the information bits are inserted into an RLL code based on a modulation table that has a variable-length conversion rule;

setting means for setting a control section that is used for calculating a value of the information bit; and determination means for determining the value of the information bit inserted into the control section by calculating the code of the control section, wherein the insertion means inserts identification information relating to a position of a block of the control section into a synchronization signal.

15. A recording medium that is recorded by using a channel bit that is modulated in accordance with the data modulation method according to claim 14.

16. A program embodied on a non-transitory computer readable storage medium that causes a computer to serve as:

insertion means for inserting information bits into data at a predetermined interval;

conversion means for converting the data into which the information bits are inserted into an RLL code based on a modulation table that has a variable-length conversion rule;

setting means for setting a control section that is used for calculating a value of the information bit; and determination means for determining the value of the information bit inserted into the control section by calculating the code of the control section, wherein the insertion means inserts identification information relating to a position of a block of the control section into a synchronization signal.

17. A data modulation apparatus comprising:

an insertion unit configured to insert information bits into data at a predetermined interval;

a conversion unit configured to convert the data into which the information bits are inserted into an RLL code based on a modulation table that has a variable-length conversion rule;

a setting unit configured to set a control section that is used for calculating a value of the information bit; and a determination unit configured to determine the value of the information bit inserted into the control section that is different from a calculation target by calculating the code of the control section.

18. A data modulation apparatus comprising:

an insertion unit configured to insert information bits into data at a predetermined interval;

a conversion unit configured to convert the data into which the information bits are inserted into an RLL code based on a modulation table that has a variable-length conversion rule;

a setting unit configured to set a control section that is used for calculating a value of the information bit; and a determination unit configured to determine the value of the information bit inserted into the control section by calculating the code of the control section, wherein the insertion unit inserts identification information relating to a position of a block of the control section into a synchronization signal.

* * * * *